(12) United States Patent
Mizutani et al.

(10) Patent No.: US 6,830,872 B2
(45) Date of Patent: Dec. 14, 2004

(54) PLANOGRAPHIC PRINTING PLATE PRECURSOR PROVIDED WITH AN IMAGE FORMING LAYER CONTAINING A FLUORINE MACROMOLECULAR COMPOUND

(75) Inventors: Kazuyoshi Mizutani, Shizuoka-ken (JP); Shiro Tan, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/247,656

(22) Filed: Sep. 20, 2002

(65) Prior Publication Data

US 2003/0170559 A1 Sep. 11, 2003

(30) Foreign Application Priority Data

Sep. 21, 2001 (JP) ........................................ 2001-288569

(51) Int. Cl.[7] .................. G03F 7/038; G03F 7/039; G03F 7/09
(52) U.S. Cl. ................ 430/276.1; 430/176; 430/192; 430/197; 430/270.1; 430/278.1; 430/907; 430/964; 430/275.1
(58) Field of Search .................. 430/907, 270.1, 430/278.1, 176, 192, 197, 964, 275.1, 276.1

(56) References Cited

U.S. PATENT DOCUMENTS

| | | | | |
|---|---|---|---|---|
| 3,414,549 A | * | 12/1968 | Schaefgen | |
| 3,444,148 A | * | 5/1969 | Adelman | |
| 6,503,686 B1 | * | 1/2003 | Fryd et al. | 430/270.1 |
| 6,610,456 B2 | * | 8/2003 | Allen et al. | 430/270.1 |
| 6,610,465 B2 | * | 8/2003 | Rahman et al. | |
| 2002/0197557 A1 | * | 12/2002 | Kishimura et al. | 430/270.1 |
| 2003/0129527 A1 | * | 7/2003 | Kudo et al. | 430/270.1 |
| 2003/0224283 A1 | * | 12/2003 | Allen et al. | 430/270.1 |

FOREIGN PATENT DOCUMENTS

| | | |
|---|---|---|
| JP | 54-135004 | 10/1979 |
| JP | 62-170950 | 7/1987 |
| JP | 8-15858 | 1/1996 |
| JP | 2000-19724 | 1/2000 |
| JP | 2000-187318 | 7/2000 |

\* cited by examiner

*Primary Examiner*—Richard L. Schilling
(74) *Attorney, Agent, or Firm*—Sughrue Mion, PLLC

(57) ABSTRACT

Disclosed is planographic printing plate precursor comprising a support having disposed thereon an image forming layer containing a fluorine macromolecular compound having a structural unit derived from a monomer represented by the following general formula (I). In the general formula (I), $R^0$ represents a hydrogen atom, a methyl group, a cyano group or a halogen atom. X represents a single bond or a divalent connecting group. $R^1$ to $R^6$ each independently represent a hydrogen atom, an alkyl group, a fluorine atom or an alkyl group in which at least one hydrogen atom is substituted with a fluorine atom. Further, at least one of $R^1$ to $R^6$ represents a fluorine atom or an alkyl group in which at least one hydrogen atom is substituted with a fluorine atom.

General formula (I)

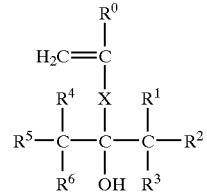

17 Claims, No Drawings

PLANOGRAPHIC PRINTING PLATE PRECURSOR PROVIDED WITH AN IMAGE FORMING LAYER CONTAINING A FLUORINE MACROMOLECULAR COMPOUND

BACKGROUND OF THE INVENTION

1. Field of the Invention

The present invention relates to a planographic printing plate precursor, and particularly to a planographic printing plate precursor which can provide a uniformly coated printing plate surface with excellent adhering ability and without such production failures as foaming.

2. Description of the Related Art

The planographic printing plate precursor comprises an image forming layer formed from an image forming composition on a support substrate, prepared by an image forming means causing an imagewise material change resulting in the division into a recording layer, and a non-image portion which is a hydrophilic an image portion which is hydrophobic. The planographic printing plate is obtained by the typical printing process wherein the hydrophilic non-image portion receives dampener and the lipophilic image portion receives ink to form an ink image. The ink image is transferred directly or indirectly to a desired printing medium to thereby obtain a printed product.

A negative type recording means which changes material from a soluble state to an insoluble state and a positive type which recording means changes material from an insoluble state to a soluble state are known for the image forming composition to be used for this process. Photo-reaction by exposure, a heat mode process, and a thermal recording system by heating are various techniques known for recording. Whatever image forming mechanism is used, planographic printing plate precursors that provide high quality images must have a highly uniform image forming layer, excellent hydrophobic ability in the image portion, and a strong ability to remove the non-image portion by developing. The damaging of the uniformity of the image forming layer is primarily related to the production steps. Insufficient uniformity in the master plates remarkably deteriorates the stable production of large numbers of high quality and highly uniform printed products, which is a fundamental necessity in printing.

Also, in order to attain high quality images, it is necessary for the image portion to have sufficient recording layer strength and good ink adhering ability. It is important for the non-image portion to be superior in the removal of the image forming layer by developing, to be free from the presence of a residual film, and to enable the exposing out of a support surface excellent in its hydrophobicity. However, strengthening the image portion region and improving its developing durability causes developing failures in the non-image portion region. Therefore the question of developing a planographic printing plate precursor capable of forming a high quality images superior in discrimination during developing has become important.

For example, technologies in which a macromolecular compound having a fluoro-aliphatic group contained in an image forming composition for the purpose of improving the uniformity of the image forming layer are disclosed in Japanese Patent Application Laid-Open No. 54-135004. This macromolecular compound can be said to be superior in that it has a high surface activity, that it is useful for improving the uniformity of the image forming layer, and in that it is highly hydrophobic and has the effect of improving developing durability because of its ability to orient to the surface of the image forming layer. However, with the improvement in developing durability there has been an undesirable reduction in developing ability, on print-making and the printing process. Therefore, technologies that improve these drawbacks using a copolymer containing a monomer unit comprising a fluoro-aliphatic group and a monomer unit comprising a specific functional group have been investigated. For instance, an attempt to improve surface activity by the introduction of other functional groups is stated in Japanese Patent Application Laid-Open (JP-A) No. 62-170950. A solution to the problem or the delay in developing created by hydrophobic characteristics is disclosed in JP-A No. 8-15858. The effect obtained by the formation of a high contrast image by the compatibility of the hydrophobic characteristics of the image line portion and the removability of the non-image line portion by making use of the hydrophobic characteristics and orientating force is disclosed in JP-A No. 2000-19724.

A macromolecular compound with a monomer unit comprising two or more fluoro-aliphatic groups to obtain an image forming material superior in the discrimination of the solubility of the image line portion and the non-image line portion is disclosed in JP-A No. 2000-187318.

As stated above, utilizing the image forming layer containing a fluoro-aliphatic compound may improve the efficiency of the planographic printing plate precursor to a certain degree, but it is still insufficient and creates the desire for further improvement.

In a case using a positive type image forming layer, as disclosed in JP-A No. 7-285275, an image recording material comprises an aqueous alkali solution-soluble resin to which a material that absorbs light to generate heat and a positive type light-sensitive compound such as quinonediazide compounds are added. The positive type light-sensitive compound works as a dissolution inhibitor which substantially decreases the solubility of the aqueous alkali solution-soluble resin in the image portion, but is decomposed by heat in the non-image portion, so that the dissolution inhibitive ability does not manifest, and it can be removed by developing to, thereby form an image.

It is also known that onium salts and compounds capable of forming a hydrogen bond network reduced in alkali solubility have the ability to inhibit the dissolution of an alkali-soluble polymer in an alkali. A positive action composition using a cationic infrared absorbing dye as an inhibitor restricting the dissolution of the aqueous alkali-soluble polymer for image recording materials using an infrared laser is described in WO 97/39894. This positive action means an action resulting in the formation of an image by using an infrared absorbing dye to absorb laser light, and by utilizing the generated heat to make the polymer film of the irradiated portion lose its dissolution inhibitive effectiveness.

Examples of a method of forming a negative type image forming layer include a recording system which uses an acid generated by light or heat as a catalyst. Heating after exposure causes the condensed crosslinking reaction, thereby curing the recording layer of the exposed portion to form the image portion. JP-A No. 7-271029 describes known techniques for a printing plate having such an acid catalyst crosslinking type recording layer. Another example is a recording system in which a polymerization reaction is caused by using a radical generated by light or heat as an initiator to cure the recording layer of the exposed portion to form the image portion. Known techniques for using a photopolymerizable or thermally polymerizable composition as a light-sensitive layer for the printing plate having a recording layer polymerized by light or heat are described in JP-A Nos. 8-108621 and 9-34110.

Image formation of the aforementioned recording materials accords with a sufficient supply of laser reduced energy for an image forming reaction on the surface of the sensitive material. However, a case using a common aluminum support has the problem of the significant heat diffusion to the support because of its good heat conductivity, so that an insufficient amount of energy is utilized for the formation of the image, creating the problem of low sensitivity. Also, there is the problem of not obtaining sufficient elimination of the dissolution inhibition or the effect of promoting an effective reaction by polymerization in the deeper areas of the sensitive material. The result is that contamination of the non-image portion caused by residual film tends to occur for the positive type and insufficient image strength with inferior anti-scratching ability is obtained the negative type.

In order to obtain good printed products, planographic printing plate precursors having as high a discrimination as possible for the image and non-image portions are preferable in view of the reproduction of the image and anti-scratching ability. A precursor that makes highly sensitive recording possible and enables handling under white light is also sought.

SUMMARY OF THE INVENTION

An object of the present invention is to solve the aforementioned problems by providing a planographic printing plate precursor superior in the uniformity of its image forming layer, that enables highly sensitive recording, has good hydrophobic characteristics for the image portion of the surface, possesses excellent resistance to the developing solution, has adhering ability and printing durability, and is superior in the removal of a non-image portion.

The inventors of the invention have proceeded with earnest studies and as a result, found that the above object can be attained by adding a macromolecular compound (hereinafter referred to as a specified fluorine macromolecular compound when required) comprising a specified fluorine type structural unit in the image forming layer, and so have thereby completed the invention.

Accordingly, a planographic printing plate precursor according to the invention comprises an image forming layer containing a fluorine macromolecular compound having a structural unit derived from a monomer represented by the following general formula (I) on a support.

General formula (I)

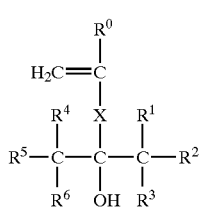

wherein $R^0$ represents a hydrogen atom, a methyl group, a cyano group or a halogen atom, X represents a single bond or a divalent connecting group, $R^1$ to $R^6$ each independently represent a hydrogen atom, an alkyl group, a fluorine atom or an alkyl group in which at least one hydrogen atom is substituted with a fluorine atom; wherein at least one of $R^1$ to $R^6$ represents a fluorine atom or an alkyl group in which at least one hydrogen atom is substituted with a fluorine atom.

Those monomers represented by the general formula (I) in which X is —$CH^2$— or —Ph— are preferable.

Also, those fluorine macromolecular compounds comprising at least one structural unit derived from poly(oxyalkylene)acrylate and/or poly(oxyalkylene) methacrylate, besides the aforementioned fluorine type structural unit and a structural unit derived from a monomer represented by the following general formula (II), are preferable embodiments.

General formula (II)

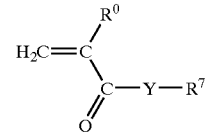

wherein $R^0$ represents a hydrogen atom, a methyl group, a cyano group or a halogen atom, Y represents a single bond or a divalent connecting group, and $R^7$ represents an alkyl group having 1 to 20 carbon atoms.

Although how the materials effect the carrying out of the invention is not precisely clear, it is considered that since the image forming layer contains the aforementioned specified fluorine macromolecular compound, this polymer provides during the step of forming an image forming layer on the support, a uniform coated surface without any surface abnormalities caused by the foaming of the coating solution due to its excellent surface activity. A uniform image forming layer is obtained thereby restricting local reductions in sensitivity caused by a lack in uniform thickness. Also the hydrophobic characteristics of the layer improve the ink adhering ability.

Moreover, the addition of a fluorine macromolecular compound ensures by the functioning of the fluorine type structural unit localized on the surface that image strength in the vicinity of the surface is improved along developing durability. Excellent discrimination and the limitation of fogging caused by diffused and reflected light in the laser light-sensitive photopolymerizable image forming layer means that a higher printing durability can be expected.

In a positive type image forming layer, the carrying out of the same operative action also enlarges discrimination and heightens image strength so that the image, even a portion touched with a bare hand, does not fall away, showing improvement in stability against harmful external effects.

DETAILED DESCRIPTION OF THE INVENTION

A planographic printing plate according to the present invention is characterised in that if comprises an image forming layer containing a specified fluorine macromolecular compound, and, if desired, a protective layer, an intermediate layer, a backcoat layer and the like on a support.

First, the essential component of the image forming layer of the invention, the specified fluorine macromolecular compound, will be explained.

The fluorine macromolecular compound used in the invention is a polymer containing a structural unit derived from a monomer represented by the following general formula (I), namely a polymer obtained by polymerizing said monomer. In view of improving film characteristics, it is preferably not a homopolymer of the aforementioned structural unit, but a copolymer containing other structural units. Preferable examples of the above other structural units contained in the specified fluorine macromolecular compound according to the invention include, as described below, acryl type or methacryl type structural units and vinyl type structural units copolymerizable with these structural units.

General formula (I)

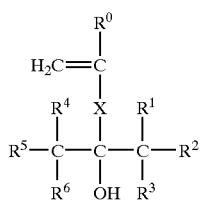

In the general formula (I), $R^0$ represents a hydrogen atom, a methyl group, a cyano group or a halogen atom. Preferably, $R^0$ represents a hydrogen atom or a methyl group.

$R^1$ to $R^6$ each independently represent a hydrogen atom, an alkyl group, a fluorine atom or an alkyl group in which at least one hydrogen atom is substituted with a fluorine atom; and wherein at least one of $R^1$ to $R^6$ represents a fluorine atom or an alkyl group in which at least one hydrogen atom is substituted with a fluorine atom.

X represents a single bond or a divalent connecting group and is preferably an alkylene group having 1 to 10 carbon atoms, an alkylene group having a cyclic structure having 6 to 14 carbon atoms, or an aralkylene group having 7 to 15 carbon atoms. Here, the alkylene group may be straight-chained, cyclic, or comprising a branched chain. A phenylene or a methylene group is most preferable as X in view of good polymerization characteristics for radical polymerization, anionic polymerization or cationic polymerization, during the polymerization of a macromolecular compound.

Specific examples of the monomer represented by the general formula (I) will be hereinafter explained. However, the invention is not limited by these invention.

General formula (II)

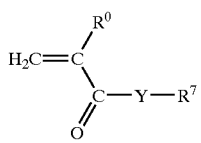

Preferable examples of the other structural units contained in the fluorine macromolecular compound include structural units derived from a monomer represented by the following general formula (II). The introduction of this structural unit improves the uniformity of the coated surface and also the film quality and strength of the image forming layer.

(F-1)

(F-2)

(F-3)

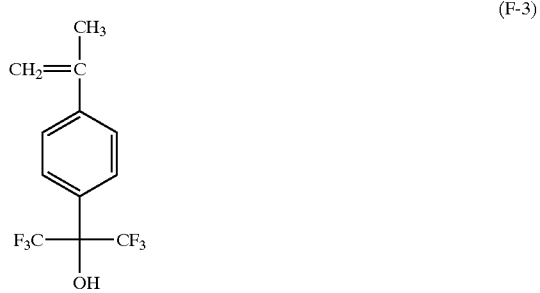

(F-4)

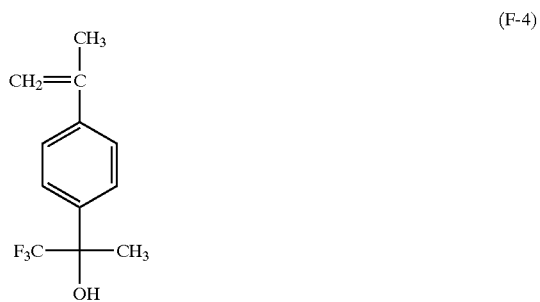

(F-5)

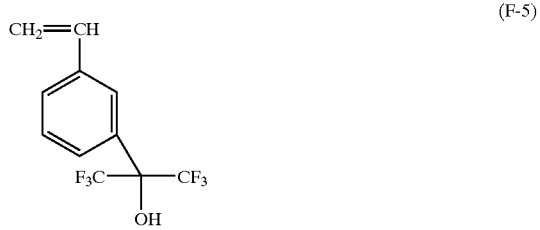

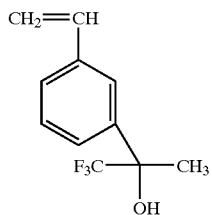 (F-6)

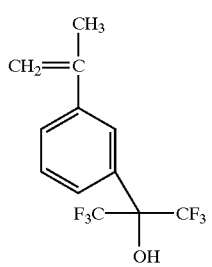 (F-7)

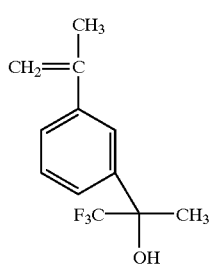 (F-8)

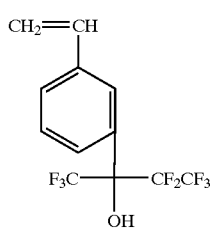 (F-9)

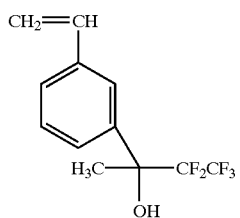 (F-10)

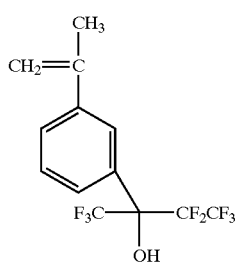 (F-11)

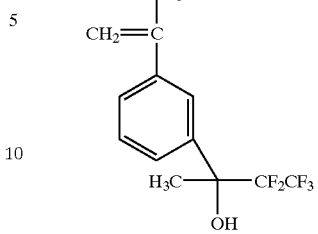 (F-12)

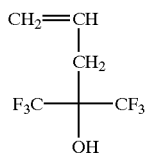 (F-13)

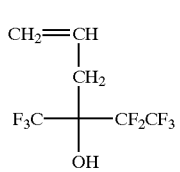 (F-14)

In the aforementioned general formula (II), $R^0$ represents a hydrogen atom, a methyl group, a cyano group or a halogen atom. $R^0$ preferably represents a hydrogen atom or a methyl group.

Y represents a single bond or a divalent connecting group and specifically, is preferably an oxygen atom, a sulfur atom, —N($R^5$)— or the like. Here, $R^5$ represents a hydrogen atom or an alkyl group having 1 to 4 carbon atoms, preferably a methyl group, an ethyl group, a propyl group, a butyl group or the like. A more preferable form of $R^5$ is a hydrogen atom or a methyl group.

Specifically, an oxygen atom, —N(H)— or —N($CH_3$)— are more preferable as Y.

$R^7$ represents an alkyl group having 1 to 20 carbon atoms and is preferably an alkyl group having 4 or more and 20 or less carbon atoms. The alkyl group may be straight-chained, cyclic, may comprise a branches or a substituent. Preferable examples of the substituent include a hydroxyl group, an alkylcarbonyl group, an arylcarbonyl group, a carboxyl group, an alkyl ether group, an aryl ether group, a halogen atom such as a fluorine atom, a chlorine atom and a bromine atom, a nitro group, a cyano group and an amino group. The substituent is not limited to those examples.

Examples of the alkyl group having 4 or more and 20 or less carbon atoms are a butyl group, a pentyl group, a hexyl group, a heptyl group, an octyl group, a nonyl group, a decyl group, an undecyl group, a dodecyl group, a tridecyl group, a tetradecyl group, a pentadecyl group, an octadecyl group and an eicosanyl group. The above may be straight-chained or may comprise branched chain(s). Monocyclic cycloalkyl groups such as a cyclohexyl group and a cycloheptyl group, and polycyclic cycloalkyl groups such as a bicycloheptyl group, a bicylodecyl group, a tricycloundecyl group, a tetracyclododecyl group, an adamantyl group, a norbornyl group and a tetracyclodecyl group may be preferably used as the alkyl group comprising a cyclic structure.

Specific examples of the monomer represented by the general formula (II) will be shown below. However, the invention is not intended to be limited by these examples.
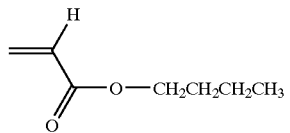
A-1
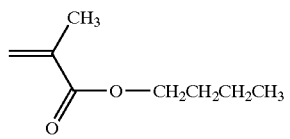
A-2
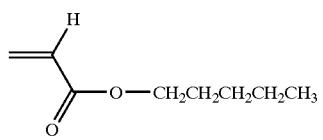
A-3
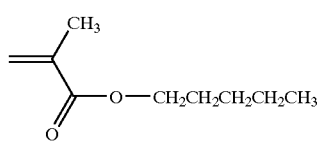
A-4
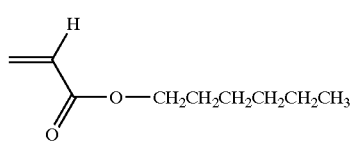
A-5
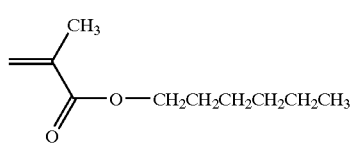
A-6
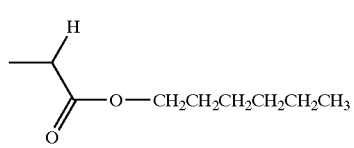
A-7
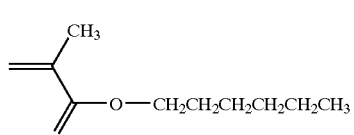
A-8
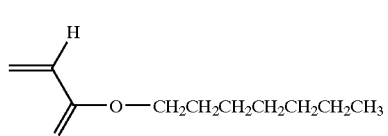
A-9
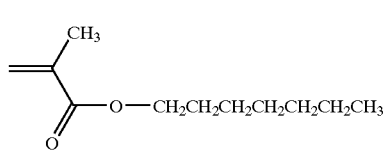
A-10
-continued
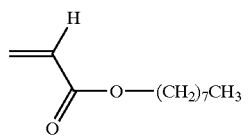
A-11
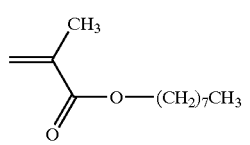
A-12
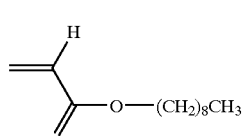
A-13
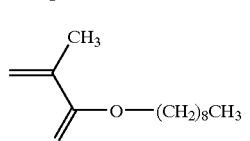
A-14
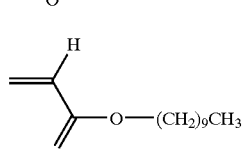
A-15
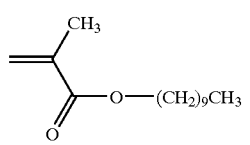
A-16
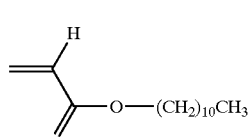
A-17
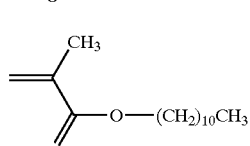
A-18
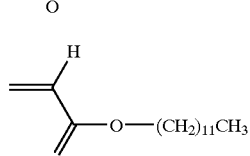
A-19
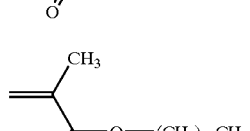
A-20
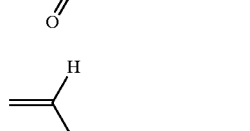
A-21

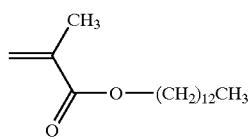 A-22
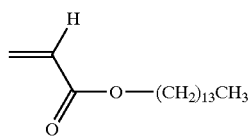 A-23
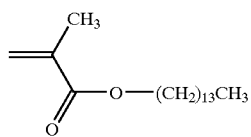 A-24
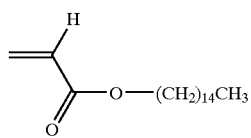 A-25
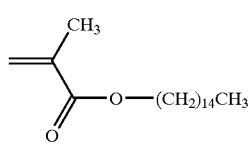 A-26
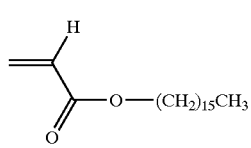 A-27
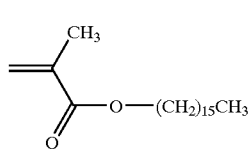 A-28
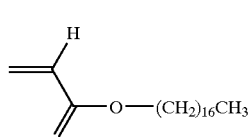 A-29
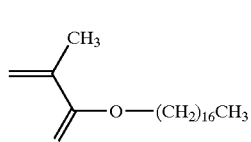 A-30
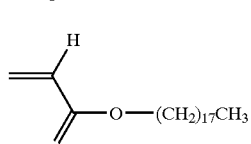 A-31
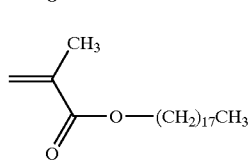 A-32
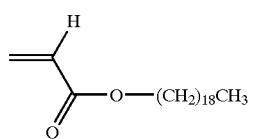 A-33
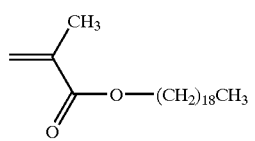 A-34
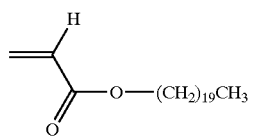 A-35
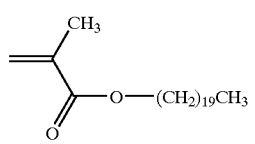 A-36
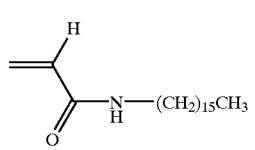 A-37
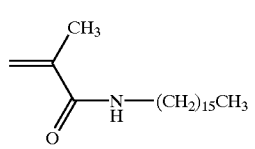 A-38
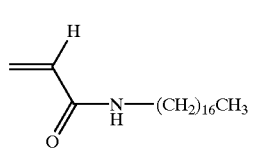 A-39
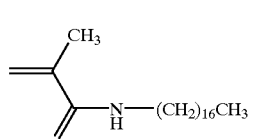 A-40
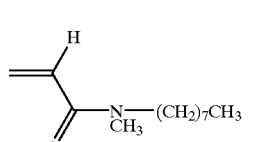 A-41
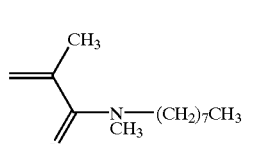 A-42
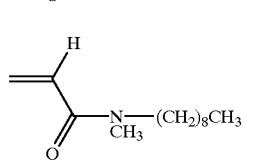 A-43

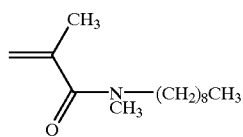
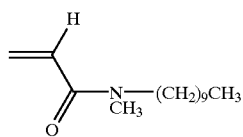
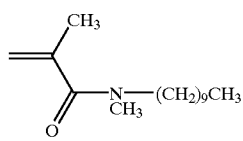
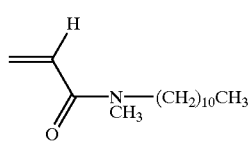
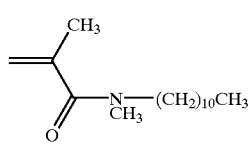
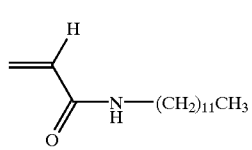
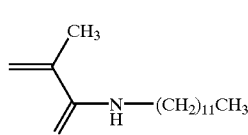
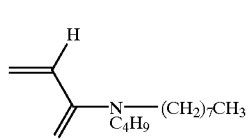
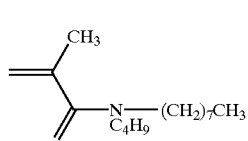
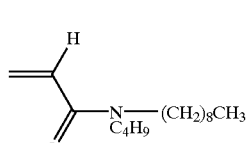
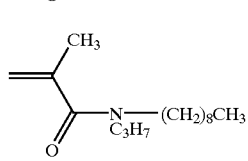
A-44
A-45
A-46
A-47
A-48
A-49
A-50
A-51
A-52
A-53
A-54
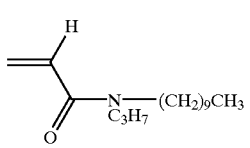
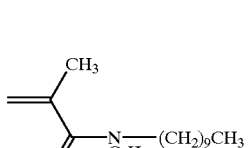
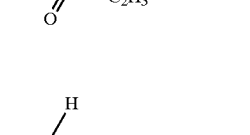
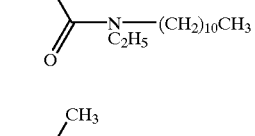
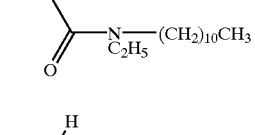
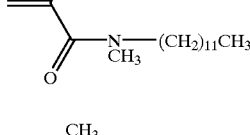
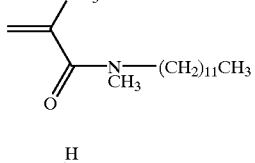
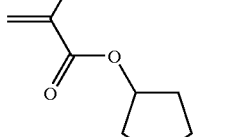
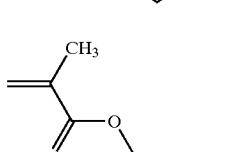
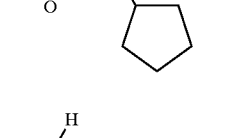
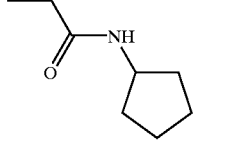
A-55
A-56
A-57
A-58
A-59
A-60
A-61
A-62
A-63

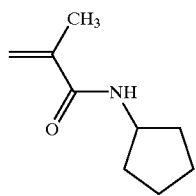
A-64
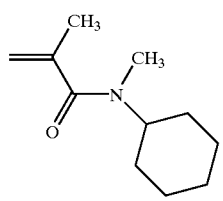
A-72
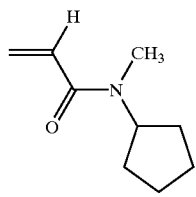
A-65
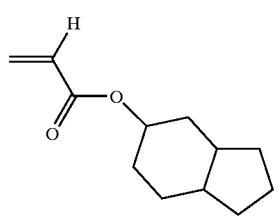
A-73
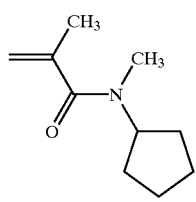
A-66
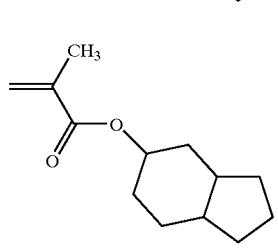
A-74
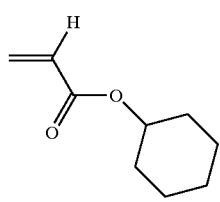
A-67
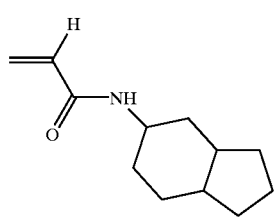
A-75
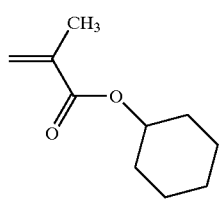
A-68
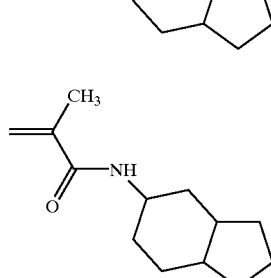
A-76
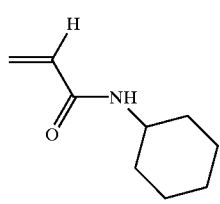
A-69
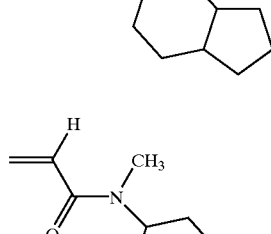
A-77
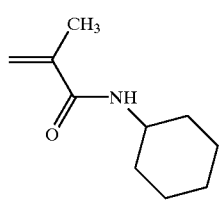
A-70
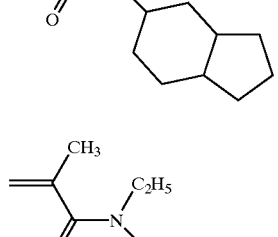
A-78
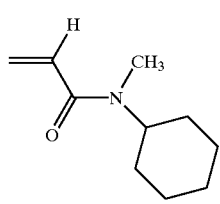
A-71
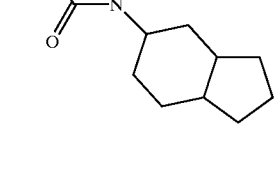

A-79 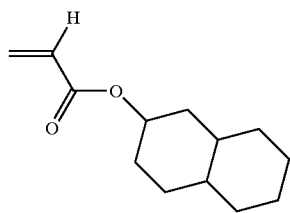
A-80 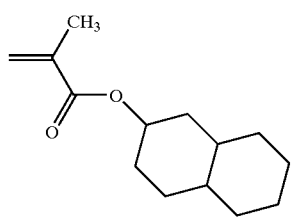
A-81 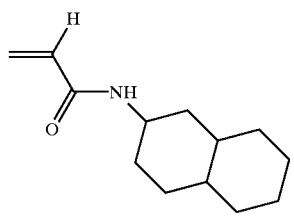
A-82 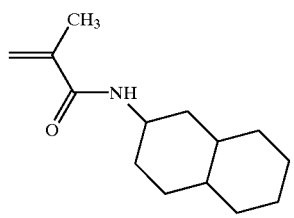
A-83 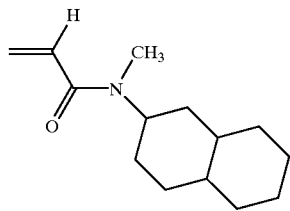
A-84 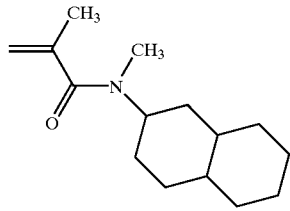
A-85 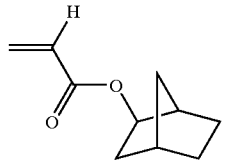
A-86 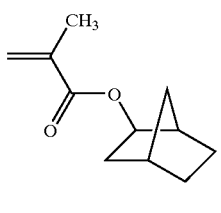
A-87 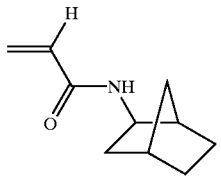
A-88 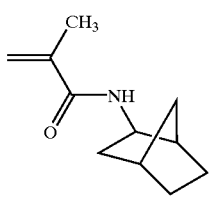
A-89 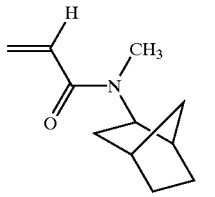
A-90 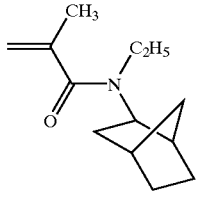
A-91 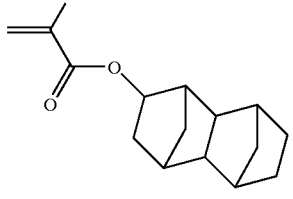
A-92 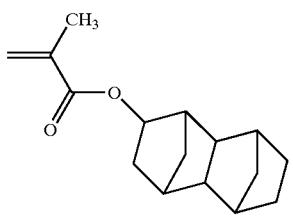

A-93 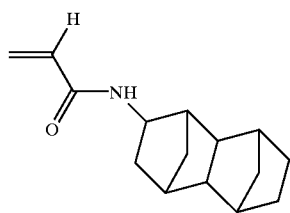
A-94 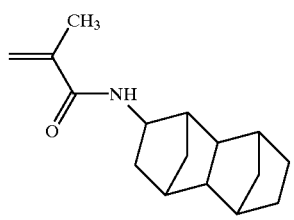
A-95 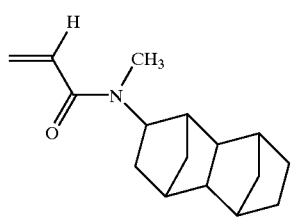
A-96 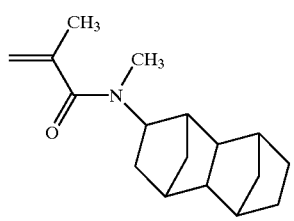
A-97 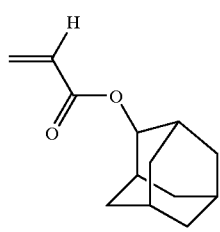
A-98 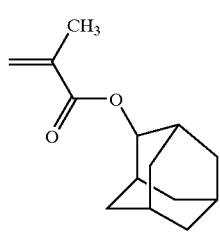
A-99 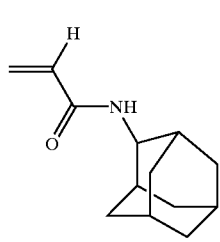
A-100 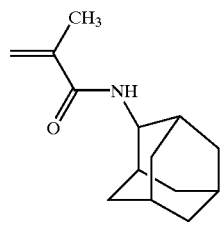
A-101 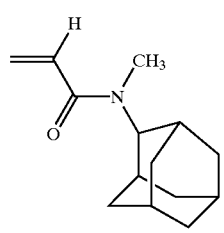
A-102 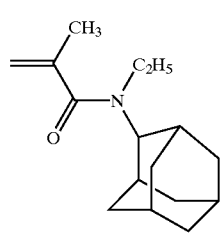
A-103 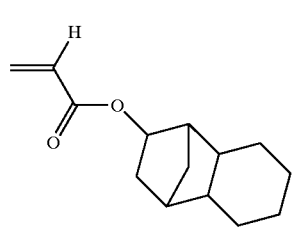
A-104 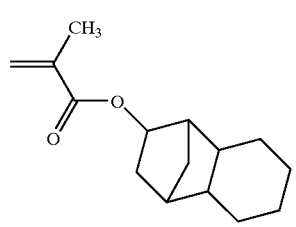
A-105 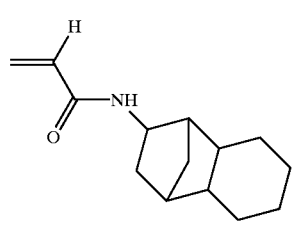
A-106 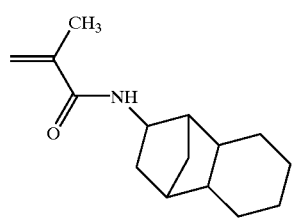

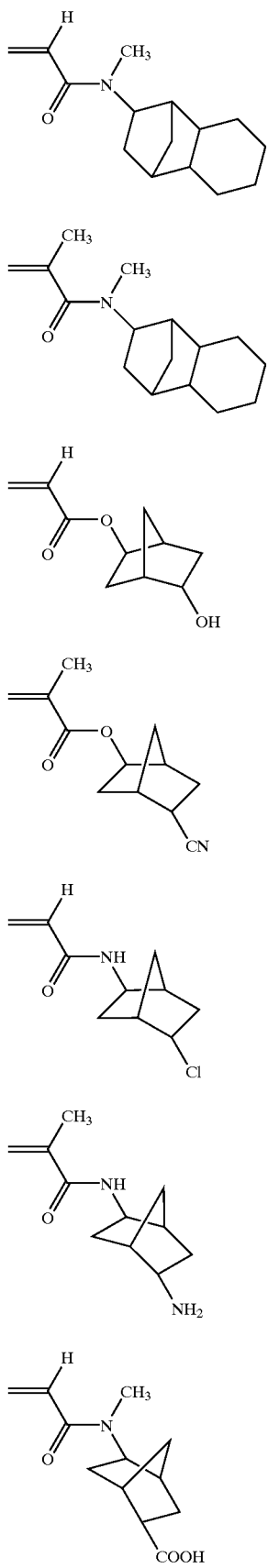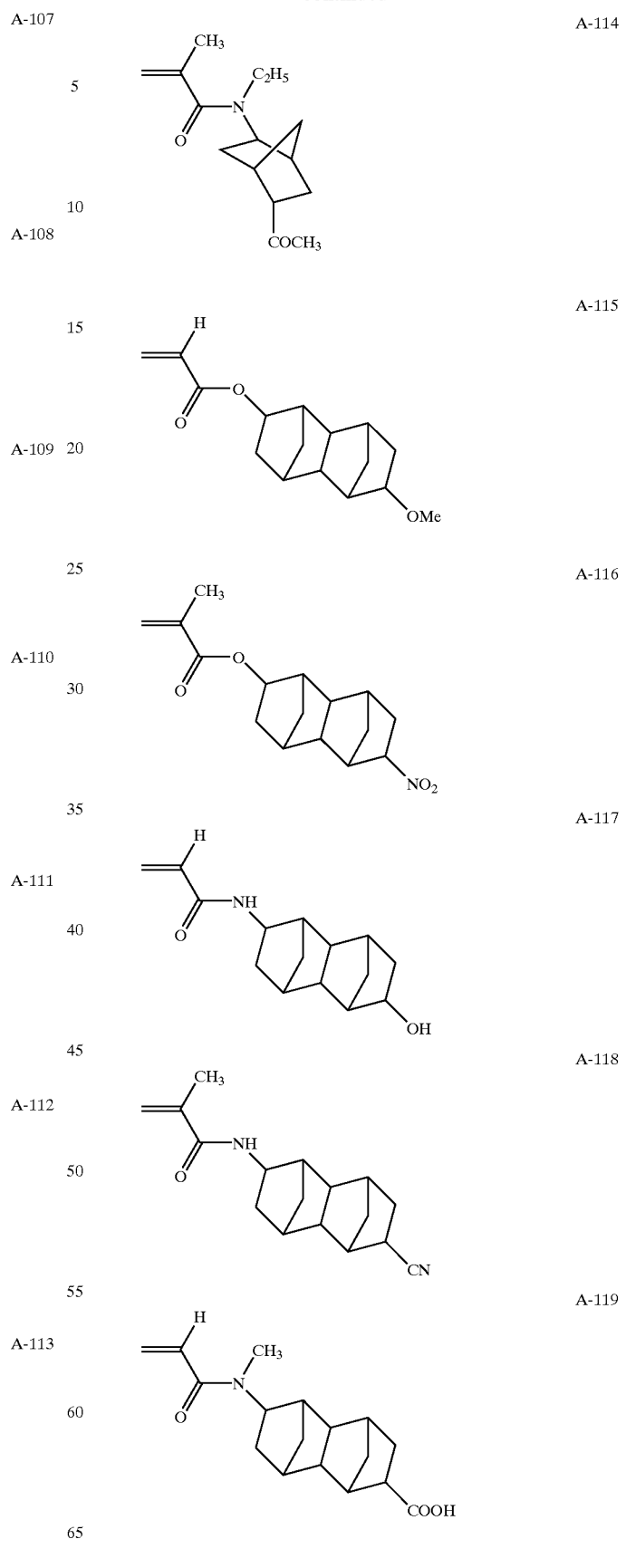

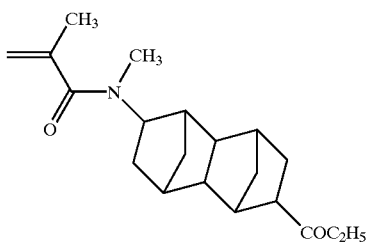
A-120

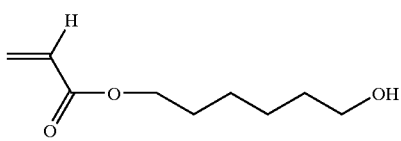
A-121

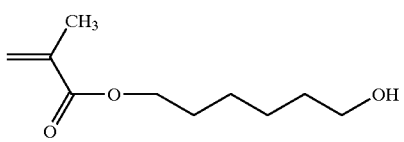
A-122

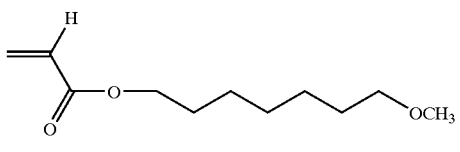
A-123

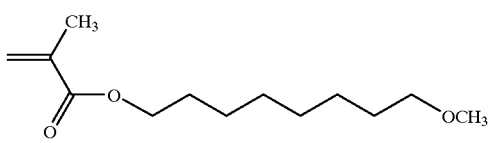
A-124

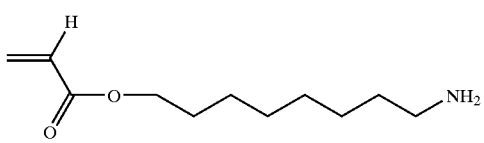
A-125

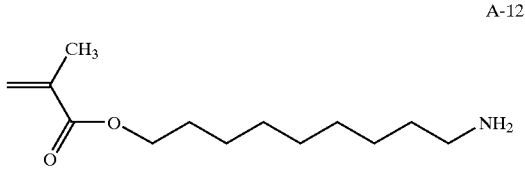
A-126

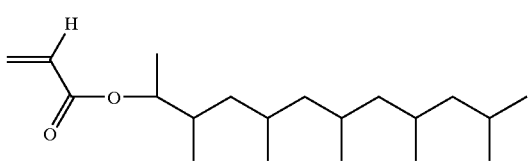
A-127

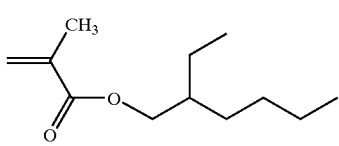
A-128

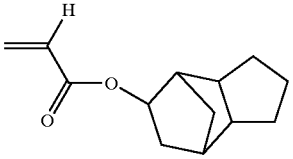
A-129

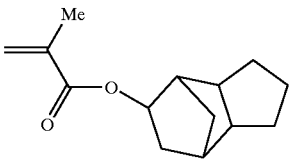
A-130

According to the invention, examples of other preferable structural units constituting the fluorine macromolecular compound include structural units derived from poly(oxyalkylene)acrylate and/or poly(oxyalkylene)methacrylate. The inclusion of these structural units makes it possible to accomplish a more uniformly coated surface for the image forming layer.

An explanation will be given below of the structural unit derived from poly(oxyalkylene)acrylate and/or poly(oxyalkylene)methacrylate.

Here, the polyoxyalkylene group may be represented by the general formula $(OR)_x$, where R is preferably an alkylene group having 2 to 4 carbon atoms. Specific and preferable examples of R include —$CH_2CH_2$—, —$CH_2CH_2CH_2$—, —$CH(CH_3)$ $CH_2$— or —$CH(CH_3)$ $CH(CH_3)$—.

The oxyalkylene units in the aforementioned poly(oxyalkylene) group may be the same as those in the case of poly(oxypropylene), or may be those in which two or more mutually different oxyalkylenes are distributed at random, in which there are straight-chain or branched oxypropylene or oxyethylene units, or those in which these units exist in blocks of straight-chain or branched oxypropylene units and a block of oxyethylene units. These poly(oxyalkylene) chains may include those connected by one or more chain bonds (e.g., —CONH—Ph—NHCO—, —S—: Ph represents a phenylene group). When the chain bond has three or more valences, a means is provided to obtain a branched oxyalkylene unit. Also, when this copolymer is used in the invention, a molecular weight of the poly(oxyalkylene) group from 250 to 3000 is suitable.

Poly(oxyalkylene) acrylate and methacrylate may be produced by reacting a commercially available hydroxypoly(oxyalkylene) material (trade names of example products of this material are, Pluronic (manufactured by Asahi Denka Kogyo K. K.); Adeka Polyether (manufactured by Asahi Denka Kogyo K. K.); Carbowax (manufactured by Glico Products); Toriton (manufactured by Rohm and Haas); and P.E.G (manufactured by Dai-ichi Kogyo Seiyaku Co., Ltd.) with an acrylic acid, a methacrylic acid, an acryl chloride, a methacryl chloride or an acrylic anhydride according to a known method. Other than the above, producing poly(oxyalkylene)diacrylate by a known method may also be used.

For the fluorine macromolecular compound of the invention, the structural unit derived from the monomer represented by the aforementioned general formula (I) is preferably included in an amount ranging from 5 mol % or more, more preferably 5 to 70 mol %, and most preferably 7 to 60 mol %, of the total structural units constituting the polymer. If the content is less than 5 mol %, the effects of the invention such as an ink-adhering and improving printing durability by the orientation of surface characteristics, can only be obtained with difficulty, whereas if the content exceeds 70 mol %, the film characteristics of the image forming layer tend to lower.

Also, the content of the structural unit derived from the preferred arbitrary structural units of poly(oxyalkylene) acrylate and/or poly(oxy alkylene)methacrylate is preferably an amount of 10 mol % or more, more preferably 15 to 70 mol % and most preferably 20 to 60 mol % of the total structural units of the fluorine macromolecular compound.

The content of the structural unit represented by the general formula (II) as a preferred form of the invention is preferably 3 mol % or more, more preferably in a range from 5 to 50 mol % and most preferably in a range from 10 to 40 mol % of the total structural units of the fluorine macromolecular compound.

It is essential that the fluorine macromolecular compound of the invention uses the monomer represented by the general formula (I) as its raw material. The fluorine macromolecular compound is more preferably obtained by copolymerizing the monomer of the aforementioned general formula (I) with poly(oxyalkylene)acrylate and/or poly (oxyalkylene)methacrylate or the monomer represented by the general formula (II). In addition to each of the aforementioned monomers, other monomers copolymerizable with these monomers may be reacted to obtain copolymers if the effects obtained by the invention are not impaired.

The copolymerization ratio of said copolymerizable monomers is preferably 20 mol % or less, and more preferably 10 mol % or less of the total monomers constituting the specified fluorine macromolecular compound.

As for the copolymerizable monomers used in combination here, those described in "*Polymer Handbook*", 2nd ed., J. Brandrup, Wiley Interscience (1975), Chapter 2, pp. 1 to 483, may be used.

Examples of such a monomer include compounds which have one additional polymerizable unsaturated bond and are selected from an acrylic acid, a methacrylic acid, acrylates, methacrylates, acrylamides, methacrylamides, allyl compounds, vinyl ethers and vinyl esters.

Specific examples of such monomers are the followings.

Acrylates:

Examples of acrylates are methylacrylate, ethylacrylate, propylacrylate, chloroethylacrylate, 2-hydroxyethylacrylate, trimethylolpropanemonoacrylate, benzylacrylate, methoxybenzylacrylate, furfurylacrylate, tetrahydrofurfurylacrylate and the like.

Methacrylates:

Examples of methacrylates are methylmethacrylate, ethylmethacrylate, propylmethacrylate, chloroethylmethacrylate, 2-hydroxyethylmethacrylate, trimethylolpropanemonomethacrylate, benzylmethacrylate, methoxybenzylmethacrylate, furfurylmethacrylate, tetrahydrofurfurylmethacrylate and the like.

Acrylamides:

Examples of acrylamides are acrylamides, N-alkylacrylamide (the alkyl group is preferably one having 1 to 3 carbon atoms, such as a methyl group, ethyl group and a propyl group), N,N-dialkylacrylamide (the alkyl group is preferably one having 1 to 3 carbon atoms) N-hydroxyethyl-N-methylacrylamide, N-2-acetamidoethyl-N-acetylacrylamide and the like.

Methacrylamides:

Examples of methacrylamides are methacrylamides, N-alkylmethacrylamide (the alkyl group is preferably one having 1 to 3 carbon atoms, such as a methyl group, ethyl group and a propyl group), N,N-dialkylmethacrylamide (the alkyl group is preferably one having 1 to 3 carbon atoms), N-hydroxyethyl-N-methylmethacrylamide, N-2-acetamidoethyl-N-acetylmethacrylamide and the like.

Allyl Compounds:

Examples of allyl compounds are allylesters (e.g., allyl acetate, allyl caproate, allyl caprylate, allyl laurate, allyl palmitate, allyl stearate, allyl benzoate, allyl acetoacetate and allyl lactate), allyloxyethanol and the like.

Vinyl Ethers:

Examples of vinyl ethers are alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether and hydroxyethyl vinyl ether), diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether and the like.

Vinylesters:

Examples of vinylesters are vinyl butyrate, vinyl isobutyrate, vinyltrimethyl acetate, vinyldiethyl acetate, vinyl varate, vinyl caproate, vinyl chloroacetate, vinyl dichloroacetate, vinylmethoxy acetate, vinylbutoxy acetate, vinyl lactate, vinyl-β-phenyl butylate, vinylcyclohexyl carboxylate and the like.

Dialkyl Itaconates:

Examples of dialkyl itaconates are dimethyl itaconate, diethyl itaconate, dibutyl itaconate and the like.

Dialkylesters or Monoalkylesters of Fumaric Acid:

Examples of dialkylesters or monoalkylesters of fumaric acid are dibutyl fumarate and the like; and Others: crotonic acid, itaconic acid, acrylonitrile, methacrylonitrile, maleylonitrile, styrene and the like.

The weight average molecular weight of the fluorine macromolecular compound used in the invention is preferably from 3000 to 100,000, and more preferably from 6,000 to 80,000.

It is to be noted that the fluorine macromolecular compound containing the aforementioned specified fluorine type structural unit is industrially more advantageous as compared with fluorine type compounds produced conventionally by a common electrolytic fluorination method. Its biodegradability and its reduced use of organic material make it environmentally highly safe material.

In the production of the image forming layer of the planographic printing plate precursor of the invention, the amount of the aforementioned specified fluorine macromolecular compound to be added ranges from 0.005 to 8% by weight, preferably from 0.01 to 5% by weight, and more preferably from 0.05 to 3% by weight, based on the total composition (converted into a solid) constituting the image forming layer. If the amount of the fluorine macromolecular compound to be added is less than 0.005% by weight, only an insufficient effect is obtained, whereas if the amount exceeds 8% by weight, there is the fear of lowering the drying ability of the coating film and the qualities of the image forming layer, such as for example, its sensitivity, will be adversely affected.

The specified fluorine macromolecular compound of the invention may be produced using a known method. For example, it is produced by copolymerizing the fluorine type monomer represented by the general formula (I) described above and a monomer such as a (meth)acrylate having a polyoxyalkylene group optionally combined, or a vinyl type monomer represented by the general formula (II), in an organic solvent by the addition of a common radical polymerization initiator. The specified fluorine macromolecular compound may be likewise produced by adding other addition-polymerizable unsaturated compounds optionally combined and a monomer from the above to produce a fluorine macromolecular compound according to the same method as above. Moreover, it is effective to produce the polymer by a dropping polymerization method in which the monomers and the initiator are dripped in a reactor corresponding to the polymerization characteristics of each monomer to prepare a polymer having a uniform composition.

Specific examples of the structure of the specified fluorine macromolecular compound of to the invention are shown in Tables 1 to 3 below. However, the invention is not limited by these examples. The numerals in each general formula indicate the molar ratio of each monomer component. Mw represents the weight average molecular weight.

TABLE 1

| | Polymer structure (molar ratio) | Mw |
|---|---|---|
| P-1 | —(CH$_2$CH)[phenyl with C(CF$_3$)$_2$OH]— —(CH$_2$CH)[CO$_2$(C$_2$H$_4$O)$_{20}$CH$_3$]— (30/70) | 15000 |
| P-2 | —(CH$_2$CH)[phenyl with C(CF$_3$)$_2$OH]— —(CH$_2$CH)[CO$_2$(C$_3$H$_6$O)$_{20}$CH$_3$]— (30/70) | 13000 |
| P-3 | —(CH$_2$CH)[phenyl with C(CF$_3$)$_2$OH]— —(CH$_2$C)(CH$_3$)[CO$_2$(C$_3$H$_6$O)$_{20}$CH$_3$]— (40/60) | 16500 |
| P-4 | —(CH$_2$CH)[phenyl with C(CF$_3$)$_2$OH]— —(CH$_2$C)(CH$_3$)[CO$_2$(C$_2$H$_4$O)$_7$CH$_3$]— (30/70) | 24000 |
| P-5 | —(CH$_2$CH)[phenyl with C(CF$_3$)$_2$OH at meta]— —(CH$_2$CH)[CO$_2$(C$_2$H$_4$O)$_{20}$CH$_3$]— (35/65) | 31000 |

TABLE 2

| | Polymer structure (molar ratio) | Mw |
|---|---|---|
| P-6 | —(CH$_2$CH)[phenyl with C(CF$_3$)$_2$OH]— —(CH$_2$CH)[CO$_2$(C$_2$H$_4$O)$_{20}$CH$_3$]— —(CH$_2$CH)[CO$_2$C$_{12}$H$_{25}$]— (30/50/20) | 53000 |

TABLE 2-continued
| Polymer structure (molar ratio) | Mw |
|---|---|
| P-7 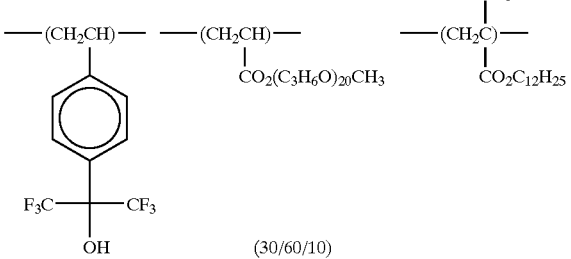 (30/60/10) | 25000 |
| P-8 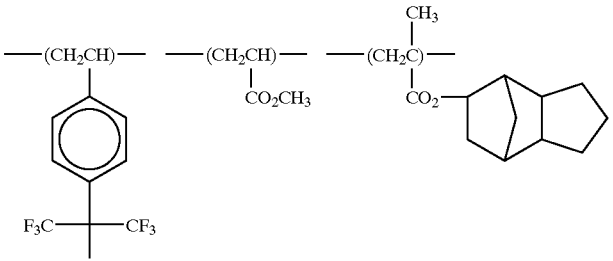 (30/60/10) | 41000 |
| P-9 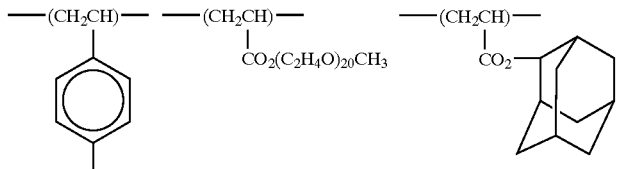 (40/50/10) | 24000 |
| P-10 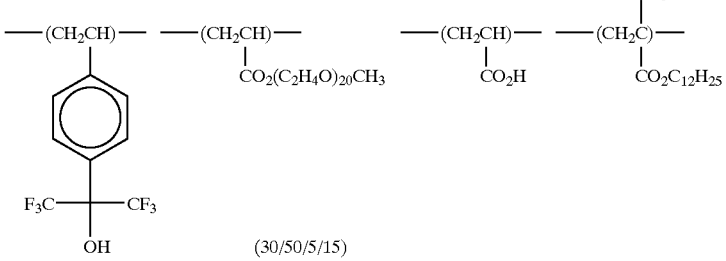 (30/50/5/15) | 59000 |
TABLE 3
| Polymer structure (molar ratio) | Mw |
|---|---|
| P-11 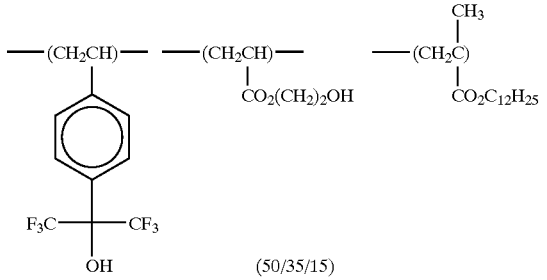 (50/35/15) | 49000 |

TABLE 3-continued

| Polymer structure (molar ratio) | Mw |
| --- | --- |

P-12: —(CH$_2$CH)— —(CH$_2$CH)— —(CH$_2$C(CH$_3$))—
with phenyl-C(CF$_3$)$_2$OH, CN, CO$_2$C$_{12}$H$_{25}$ substituents (40/30/20), Mw 45000

P-13: —(CH$_2$CH)— —(CH$_2$CH)— —(CH$_2$CH)—
with phenyl-C(CF$_3$)$_2$OH, CO$_2$CH$_3$, CO$_2$-adamantyl substituents (50/30/20), Mw 29000

P-14: —(CH$_2$CH)— —(CH$_2$CH)— —(CH$_2$C(CH$_3$))—
with phenyl-C(CF$_3$)$_2$OH, CO$_2$(CH$_2$)$_2$OH, CO$_2$-bornyl substituents (40/20/40), Mw 34000

P-15: —(CH$_2$CH)— —(CH$_2$CH)— —(CH$_2$C(CH$_3$))—
with phenyl-C(CF$_3$)$_2$OH, CONHCH(CH$_3$)CH$_3$, CO$_2$-(4-tert-butylcyclohexyl) substituents (40/20/40), Mw 35000

Next, an explanation will be given concerning other components required for the composition that forms the image forming layer of the invention. There is no particular limitation to the structure of the image forming layer, and the invention is applicable to both a negative type wherein the image forming layer changes from an insoluble state to a soluble state, and a positive type wherein the image forming layer changes from a soluble state to an insoluble state, by exposure or heating.

Any composition may be used for the composition that forms the positive type image forming layer as long as there is an increase in solubility and swelling in the developing solution after exposure and heating. Examples of the positive type recording layer include known positive type polarity converting material type (changes from hydrophobic hydrophilic), acid catalyst decomposition type, and interaction releasing type (heat-sensitive positive type) recording layers.

As for preferable components of the positive type image forming layer, (P-1) positive type light-sensitive compositions containing an o-quinonediazide compound, (P-2) chemical amplified type compositions comprising a combination of a compound obtained by protecting an alkali-soluble group with an acid-decomposable group and a photo-acid generator, and (P-3) light-sensitive compositions comprising a light-heat converting agent, an alkali-soluble resin and, as required, a compound which is heat-decomposable and substantially lowers the solubility of the alkali-soluble binder in a non-decomposed state. The compositions enable recording using an infrared laser.

The o-quinonediazide compounds used in the embodiment (P-1) are preferably compounds which have at least one o-quinonediazide group that increase in solubility in an aqueous alkali solution by the application of active rays.

Compounds with various structures are known as such compounds, and they are described in dEtail in "Light- Sensitive Systems", by J. KOSAR, phblished by John Wiley & Sons, Inc, 1965, p.336 to p.352. Sulfonates of various hydroxyl compounds and o-benzoquinonediazide or o-naphthoquinonediazide are particularly preferable as light-sensitive compounds of the positive type light-sensitive resin composition.

The o-quinonediazide compounds mentioned above are described specific in detail, in a previous proposal by the applicant of this invention in paragraphs 61 to 63, 113 and 114 of Japanese Patent Application No. 2001-32856 (83–6013).

The o-quinonediazide compounds are included in an amount generally ranging from 5 to 60% by weight, and more preferably from 10 to 40% by weight, based on the total solid of the light-sensitive composition (P-1).

Known compounds may be used for the photo-acid generator used in the chemically amplified type composition (P-2).

Specific examples of the photo-acid generator include onium salts such as diazonium salts, ammonium salts, phosphonium salts, iodonium salts, sulfonium salts, selenonium salts and arsonium salts; organic halogen compounds described in JP-A No. 63-298339; organic metal/organic halides described in JP-A No. 2-161445, photo-acid generators having an o-nitrobenzyl type protecting group as described in JP-A No. 60-198538; compounds represented by iminosulfonate and photodecomposed to generate sulfonic acid as described in JP-A No. 2-245756; and disulfone compounds as described in JP-A No. 61-166544.

Examples of the counter ion of the onium salt are tetrafluoroboric acid, hexafluorophosphoric acid, triisopropyl-naphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid and paratoluenesulfonic acid. Among these compounds, alkyl aromatic sulfonic acids such as hexafluorophosphoric acid, triisopropylnaphthalenesulfonic acid and 2,5-dimethylbenzenesulfonic acid are particularly preferable.

The photo-acid generators mentioned above are described in specific detail in Japanese Patent Application No. 2001-32856, paragraphs 65 to 67.

The compound that is decomposed by irradiation with the aforementioned active rays or radial rays to generate an acid is generally added at an amount that ranges from 0.001 to 40% by weight, preferably from 0.01 to 20% by weight, and more preferably from 0.1 to 5% by weight based on the total weight (converted into solid) of the light-sensitive composition.

Examples of the compound obtained by protecting the alkali-soluble group with an acid decomposable group in combination with the photo-acid generator in the embodiment (P-2) are compounds having a —C—O—C— or —C—O—Si— bond, such as those stated below.

a) Compounds which include at least one orthocarboxylate and a compound selected from carboxylic acid amideacetals, that have polymerization ability, and in which the above amideacetals can occur as a crosslinking element in the main chain or a side substituent.
b) Oligomeric or polymer compounds containing repetition acetals and compounds selected from ketals in the main chain.
c) Compounds containing at least one enol ester or a group of N-acylaminocarbonates.
d) Cyclic acetals or ketals of β-ketoesters or β-ketoamides.
e) Compounds containing a group of silyl ethers.
f) Compounds containing a group of silylenol ethers.
g) Monoacetals or monoketals in which aldehyde or ketone components have a solubility of 0.1 to 100 g/l in a developer.
h) Tertiary alcohol type ethes.
i) Carboxylates and carbonates of a tertiary allyl-position or benzyl-position alcohol.

The content of the compound protected with these acid-decomposable groups is generally 1 to 60% by weight, and more preferably 5 to 40% by weight, based on the total solid of the light-sensitive composition.

Water-insoluble and aqueous alkali-soluble macromolecular compounds (hereinafter referred to as an alkali-soluble resin as required) may be added to these light-sensitive compositions.

The alkali-soluble resin includes homopolymers containing an acid group on the main chain and/or side chain of the polymer, copolymers of these homopolymers, or mixtures of these polymers.

Among these polymers, those containing the following acid groups (1) to (6) on the main chain or side chain of the polymer are preferable in view of their solubility in an alkaline developer and the manifest ability to control dissolution.

(1) Phenol group (—Ar—OH)
(2) Sulfonamide group (—SO$_2$NH—R)
(3) Substituted sulfonamide type acid group (hereinafter referred to as "active imide group") [—SO$_2$NHCOR, —SO$_2$NHSO$_2$R and —CONHSO$_2$R]
(4) carboxylic acid group (—CO$_2$H)
(5) Sulfonic acid group (—SO$_3$H)
(6) Phosphoric acid group (—OPO$_3$H$_2$)

In the aforementioned (1) to (6), Ar represents a divalent aryl connecting group optionally having a substituent, and R represents a hydrocarbon group optionally having a substituent.

Among the aqueous alkali-soluble polymers containing an acid group selected from the aforementioned (1) to (6), those containing (1) a phenol group, (2) a sulfonamide group, and (3) an active imide group are preferable and those containing (1) a phenol group or (2) a sulfonamide group are most preferable in view of sufficiently ensuring solubility in an alkaline developing solution and developing latitude and film strength.

Specific examples of the aqueous alkali-soluble polymer include phenol/formaldehyde resins, cresol/formaldehyde resins, phenol/cresol/formaldehyde co-condensed resins, phenol modified xylene resins, polyhydroxystyrene, polyhydroxystyrene halide, copolymers of N-(4-hydroxyphenyl) methacrylamide, hydroquinone monomethacrylate copolymers, sulfonylimide type polymers described in JP-A No. 7-28244, and carboxyl group-containing polymers described in JP-A No. 7-36184. Other than the above, various alkali-soluble polymer compounds, such as acryl type resins having a phenolic hydroxyl group as described in JP-A No. 51-34711, and acryl type resins and urethane type resins having a sulfonamide group as described in JP-A No. 2-866, may also be used. These alkali-soluble macromolecular compounds are preferably those having a weight average molecular weight of 500 to 20,000 and a number average molecular weight of 200 to 60,000. They may be used either singly or in combinations of two or more, and are to be added at an amount of 80% by weight or less based on the total composition.

Further, as disclosed in the specification of U.S. Pat. No. 4,123,279, it is preferable to use, in combination, a condensate of formaldehyde and a phenol having an alkyl group having 3 to 8 carbon atoms as a substituent, such as a t-butylphenolformaldehyde resin and an octylphenolformaldehyde resin in view of improving the fat-sensitivity of the image. Such an alkali-soluble resin is generally used at an amount of 90% by weight or less of the total weight of the composition.

For the alkali-soluble binder used in the light-sensitive composition (P-3), the aforementioned compounds may also be used.

Various onium salts and quinoneazide compounds are preferably used for the heat-decomposable material that substantially lowers the solubility of the alkali-soluble binder in a non-decomposed state. These salts and compounds are superior in their ability to lower the solubility of the alkali-soluble binder. Examples of onium salts include diazonium salts, ammonium salts, phosphonium salts, iodonium salts, sulfonium salts, selenonium salts and arsonium salts.

Such onium salts are described in detail in a previous proposal by the applicant of the invention Japanese Patent Application No. 2001-32856, paragraphs 110 to 112. The o-quinonediazide compounds are compounds comprising at least one o-quinonediazide group and have the characteristic that they are increased in alkali-solubility by heat decomposition. The o-quinonediazide compounds exemplified previously for (p-1) may be used in the invention.

The o-quinonediazide compound is to be added at an amount of preferably 1 to 50% by weight, more preferably 5 to 30% by weight, and particularly preferably 10 to 30% by weight, based on the total solid of the image forming layer. Although these compounds may be used singly, they may be used in a mixture. When the amount of the o-quinonediazide compound added is less than 1% by weight, the image-recording ability is impaired, whereas when the amount exceeds 50% by weight, the durability of the image portion deteriorates and sensitivity is lowered.

The amount of the aforementioned compounds added besides the o-quinonediazide compounds preferably ranges from 1 to 50% by weight, more preferably from 5 to 30% by weight, and even more preferably from 10 to 30% by weight, based on the total solid of the image forming layer.

Also, any material may be used as the light-heat converting agent as long as it has the function of absorbing the infrared laser to convert it into heat. It is preferable to use pigments or dyes having infrared absorbing ability.

As for the pigment, commercially available pigments and pigments described in the Color Index (C.I.) Handbook, "Latest Pigment Handbook" (edited by the Japan Pigment Technological Society, published in 1977), the "Latest Pigment Applied Technologies" (published by CMC in 1986), and the "Printing Ink Technologies" (published by CMC in 1984), may be used.

The particle diameter of the pigment is preferably 0.01 $\mu$m to 10 $\mu$m, more preferably 0.05 $\mu$m to 1 $\mu$m, and even more preferably 0.1 $\mu$m to 1 $\mu$m. A particle diameter less than 0.0 $\mu$m is undesirable for the stability of the dispersion in the image forming layer coating solution, whereas a particle diameter exceeding 10 $\mu$m is undesirable for the uniformity of the image forming layer.

As for the dye, commercially available dyes and known dyes that have been documented (e.g., the "Dye Handbook", edited by the Organic Synthetic Chemical Society, published in 1970) may be utilized. Specific examples of these dyes include azo dyes, metal complex salt azo dyes, pyrazolone azo dyes, anthraquinone dyes, phthalocyanine dyes, carbonium dyes, quinoneimine dyes, methine dyes, cyanine dyes, diimonium dyes and aminium dyes.

Among the above, those pigments or dyes capable of absorbing infrared light or near-infrared light are particularly preferable for the invention because of their suitability for utilizing lasers emitting infrared light or near-infrared light.

Carbon black is preferably used as such a pigment. Also, examples of dyes absorbing infrared light or near-infrared light include cyanine dyes described in JP-A Nos. 58-125246, 59-84356, 59-202829 and 60-78787; methine dyes described in JP-A Nos. 58-173696, 58-181690 and 58-194595; naphthoquinone dyes described in JP-A Nos. 58-112793, 58-224793, 59-48187, 59-73996, 60-52940 and 60-63744; squarylium dyes described in JP-A No. 58-112792; cyanine dyes described in U.K. Patent No. 434,875; and dihydroperimidinesquarylium dyes described in U.S. Pat. No. 5,380,635.

Other examples of particularly preferable dyes include near-infrared absorbing dyes represented by the formulae (I) and (II) described in the specification of U.S. Pat. No. 4,756,993.

The amount of the pigment or dye to be added is preferably about 0.01 to 20% by weight, and even more preferably 0.5 to 10% by weight in the case of the dye, and 0.1 to 5% by weight in the case of the pigment, based on the total solid constituting the image forming layer.

Other Additives

A cyclic anhydride for heightening sensitivity, a print-out agent for obtaining a visible image just after exposure, dyes as image colorants, fillers and the like, may be added to the aforementioned image forming layer composition as required if the invention results are not impaired.

It is preferable to add cyclic anhydrides, phenols, and organic acids to the light-sensitive resin composition of the invention to heighten sensitivity. Examples of the cyclic anhydrides are phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride, as described in U.S. Pat. No. 4,115,128. Examples of the phenols include bisphenol A, p-nitrophenol, p-ethoxyphenol, 2,3,4-trihydroxybenzophenone, 4-hydroxybenzophenone, 2,4,4'-trihydroxybenzophenone, 4,4',4"-trihydroxy-triphenylmethane, and 4,4',3",4"-tetrahydroxy-3,5,3',5'-tetramethyltriphenylmethane.

Examples of the organic acids include sulfonic acids, sulfinic acids, alkyl sulfates, phosphonic acids, phosphinic acids, phosphates and carboxylic acids as described in, for example, JP-A Nos. 60-88942 and 2-96755. Specific examples of the organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 1,4-cyclohexene-2,2-dicarboxylic acid, erucic acid, lauric acid, n-undecanoic acid and ascorbic acid. The proportion of the aforementioned cyclic anhydrides, phenols and organic acids in the image forming layer is preferably 0.05 to 15% by weight, and more preferably 0.1 to 5% by weight as a solid content.

A combination of a light-sensitive compound which releases an acid by exposure, and an organic dye which forms an acid and a salt to change the color tone, are examples of the print-out agent for obtaining a visible image just after exposure.

Examples of the light-sensitive compound which releases an acid by exposure include o-naphthoquinonediazide compounds, triazine type compounds, oxadiazole compounds and diazonium salts. These compounds may be used either singly or in a mixture, and the amount added preferably ranges from 0.3 to 15% by weight.

An organic dye which changes its color tone by mutually interacting with the photodecomposed product of the compound, which is photodecomposed to generate an acidic substance, may be used in the light-sensitive resin composition of the invention. Diphenylmethane, triarylmethane, thiazine, oxazine, phenazine, xanthene, anthraquinone, iminonaphthoquinone or azomethine organic dyes may be used. Specific examples of the organic dyes include those described in a previous proposal by the applicant of the invention in paragraphs 79 to 80 of Japanese Patent Application No. 2001-32856.

Triarylmethane organic dyes are particularly preferable.

These dyes may be used either singly or in a mixture. The amount of the dye to be added is preferably 0.3 to 15% by weight based on the total solid of the image forming layer. Also, these dyes may be used in combination with other dyes and pigments as needed. The amount of these other dyes and pigments used is to be 70% by weight or less, and more preferably 50% by weight or less, based on the total weight of dyes and pigments.

Other embodiments of the image forming layer of the invention are negative type compositions wherein the image forming layer is changed from a soluble to an insoluble state by exposure or heating. Examples of the negative type image forming layer other than the aforementioned fluorine macromolecular compound include (N-1) photopolymerizable compositions comprising compounds containing an ethylenic double bond enabling addition polymerization or a photopolymerization initiator; (N-2) acid-crosslinkable compositions comprising a compound which generates an acid by light or heat and a crosslinkable compound using the generated acid as a catalyst; (N-3) compositions comprising a diazo resin; and (N-4) photo-crosslinking type resin compositions. Both (N-1) and (N-2) above as image forming layers make use of the same curing reaction and recording can be carried out for both using an infrared laser. Further examples are (N-1') polymerizable compositions comprising a light-heat converting agent, a heat-radical generator and a radical-polymerizable compound; and (N-2') acid-crosslinkable compositions comprising an alkali-soluble binder, an acid generator and an acid (heat) crosslinkable compound.

In the aforementioned photopolymerizable composition (N-1), the compound having a double bond enabling addition polymerization may be arbitrarily selected from compounds having at least one and preferably two or more terminal ethylenically unsaturated bonds. Examples of such compounds include those monomers, prepolymers, dimers, trimers, oligomers or mixtures of these compounds and copolymers of these compounds having the chemical structures. Examples of the monomers and copolymers include esters of unsaturated carboxylic acids (e.g., acrylic acid, methacrylic acid, itaconic acid, crotonic acid, isocrotonic acid and maleic acid) and aliphatic polyhydric alcohol compounds, and amides of unsaturated carboxylic acids and aliphatic polyvalent amine compounds.

Specific examples of the addition-polymerizable compound mentioned above are described in detail in a previous proposal by the applicant of the invention, paragraphs 84 to 89 of Japanese Patent Application No. 2001-32856.

The amount of these addition-polymerizable compounds to be added is 5 to 70% by weight, and preferably 10 to 50% by weight, based on the total solid of the image forming layer.

The photopolymerization initiator used to cause the polymerization of the addition-polymerizable compound may be selected in accordance with the wavelength of the light source to be used and also to their suitability from various photopolymerization initiators known in patents, literature and the like. Combination systems (photopolymerization initiator systems) may also be thus selected of two or more photopolymerization initiators. When using, for example, light having a wavelength of around 400 nm as a light source, benzyl, benzoin ether, Michler's ketone, anthraquinone, thioxanthone, acridine, phenazine, benzophenone or the like is widely used.

Also, in the case of using visible rays of 400 nm or more, various photopolymerization initiator systems have been proposed for an Ar laser, the second harmonic of a semiconductor laser, or a SHG-YAG laser as light sources. Examples of the photopolymerization initiator are compounds exemplified in paragraphs 91 to 92 of Japanese Patent Application No. 2001-32856, that is a previous proposal by the applicant of the invention. Particularly in the case of using a radical polymerizable composition that enables recording by infrared laser exposure, the polymerization initiator (radical polymerization initiator) may include azobisnitrile compounds such as 2,2'-azobisisobutylonitrile and 2,2'-azobispropionitrile; organic peroxides such as benzoyl peroxide, lauroyl peroxide, acetyl peroxide, t-butyl perbenzoate, α-cumyl hydroperoxide, di-t-butyl peroxide, diisopropylperoxy dicarbonate, t-butylperoxyisopropyl carbonate, peroxides, alkylperoxycarbamates and nitrosoarylacylamines; inorganic peroxides such as potassium persulfate, ammonium persulfate and potassium perchlorate; azo or diazo type compounds such as diazoaminobenzene, p-nitrobenzenediazonium, azobis substituted alkanes, diazothioethers and arylazosulfonic acids; nitrosophenylurea, tetraalkylthiuram disulfides such as tetramethylthiuram disulfide; diaryl disulfides such as dibenzoyldisulfide; dialkylxanthogenicaciddisulfides, arylsulfinic acids, arylalkylsulfonic acids and 1-alkanesulfinic acids.

The amount of these photopolymerization initiators to be used ranges from 0.05 to 100 parts by weight, preferably 0.1 to 70 parts by weight, and more preferably 0.2 to 50 parts by weight, based on 100 parts by weight of the addition-polymerizable compound.

It is also desirable to add a small amount of a thermopolymerization inhibitor to the photopolymerizable light-sensitive resin composition of the invention besides the aforementioned fundamental components to inhibit unnecessary thermopolymerization of polymerizable ethylenically unsaturated compound during the production or storage of the light-sensitive resin composition. Examples of an appropriate thermopolymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine primary cerium salt and N-nitrosophenylhydroxylamine aluminum salt. The amount of the thermopolymerizable inhibitor to be added is preferably about 0.01% to 5% based on the total weight of the composition. A higher fatty acid derivative such as behenic acid or behenic acid amide may also be added as required by being localized on the surface of the light-sensitive layer during post-application drying to prevent polymerization inhibition by oxygen. The amount of the higher fatty acid derivative to be added is preferably 0.5% to 10% based on the total composition.

The planographic printing plate of the invention may be provided with an oxygen-cutting protective layer on the photopolymerizable light-sensitive layer to prevent polymerization inhibition by oxygen.

Polyvinyl alcohol, its partial ester, ether or acetal, and copolymers of these containing an unsubstituted vinyl alcohol unit in a substantial enough amount to make these compounds have the water-solubility required for them, and water-soluble resins such as carboxymethyl cellulose, hydroxyethyl cellulose, methyl cellulose and polyvinylpyrrolidone are preferable as the raw material of the oxygen-cutting productive layer. The film thickness of the oxygen-cutting protective layer is appropriate at about 0.2 μm to 3 μm, and the amount thereof to be added is appropriate at about 0.1/m² to about 15/m² and more preferably 1.0/M² to about 5.0/m².

(N-2) Acid-Crosslinkable Composition:

A compound (acid generator) generating an acid by light or heat is indicative of a compound that generates the acid by being decomposed by irradiation with infrared rays or by heating at 100° C. or more. The generated acid is preferably a strong acid, such as sulfonic acid and hydrochloric acid, having a pKa of 2 or less.

Examples of the acid generator preferably used in the invention include onium salts such as an iodonium salt, sulfonium salt, phosphonium salt and diazonium salt. The same onium salt compounds as previously mentioned may be used.

These compounds may be used singly or in combinations of two or more. It is to be noted that because the acid generators given here can also be decomposed by irradiation with ultraviolet rays, the structure of the image forming layer in this invention also allows for recording by irradiation with as well infrared rays ultraviolet rays.

These acid generators are to be added in a proportion of 0.01 to 50% by weight, preferably 0.1 to 40% by weight, and more preferably 0.5 to 30% by weight, based on the total solid of the image forming layer. When the amount to be added is less than 0.01% by weight, no image is obtained. On the other hand, when the amount exceeds 50% by weight, staining occurs in the non-image portion during printing.

There are no particular limitations on the acid-crosslinkable agent as long as it is a compound crosslinked by an acid. Phenol derivatives (hereinafter called a low molecular phenol derivative as required) represented by the following general formula (I), polynuclear phenolic crosslinking agents represented by the following general formula (II) containing in the molecule three or more phenol rings having two or three hydroxymethyl groups on the ring, and mixtures of the aforementioned low molecular phenol derivative and polynuclear phenolic crosslinking agent and/or a resol resin are preferably used.

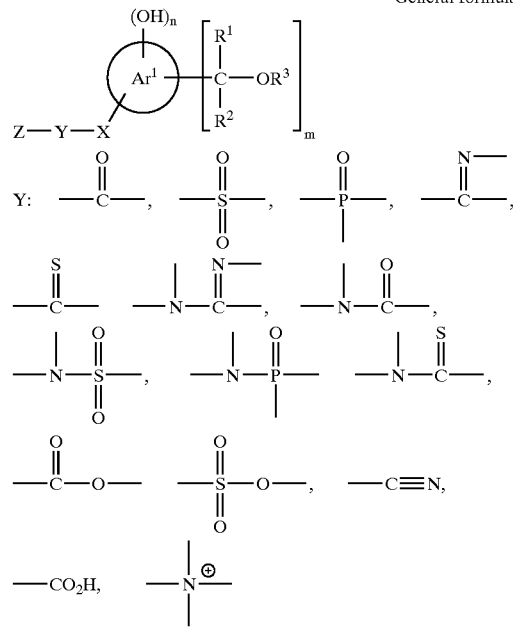

General formula (I)

wherein $Ar^1$ represents an aromatic hydrocarbon ring which may have a substituent. $R^1$ and $R^2$ which may be the same or different, and represent a hydrogen atom or a hydrocarbon group having 12 or less carbon atoms. $R^3$ represents a hydrogen atom or a hydrocarbon group having 12 or less carbon atoms; m denotes an integer from 2 to 4, n denotes an integer from 1 to 3; X represents a divalent connecting group; Y represents a monovalent to tetravalent connecting group comprising the foregoing partial structure, or a functional group having a hydrogen atom at its terminal, and Z is not present when Y is a terminal group or represents a monovalent to tetravalent connecting group or functional group which is present in accordance with the number of connecting groups represented by Y.

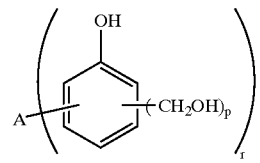

General formula (II)

wherein A represents a hydrocarbon connecting group having 1 to 20 carbon atoms and r valences; r denotes an integer from 3 to 20; and p denotes an integer of 2 or 3.

The phenol derivative represented by the general formula (I) is described in detail in paragraphs 98 to 155 of the specification of Japanese Patent Application No. 11-352210, which was previously submitted by the applicant of the invention. Also, the polynuclear type phenolic crosslinking agent represented by the above general formula (II) containing, three or more phenol rings having two or three hydroxymethyl groups on the ring in the molecule, is described in detail in paragraphs 156 to 165 of the same specification.

These crosslinking agents may be used either singly or in combinations of two or more.

In the invention, the crosslinking agent used is to be added at an amount of 5 to 70% by weight, and preferably 10 to 65% by weight, based on the total solid of the image forming layer. When the amount of the crosslinking agent to be added is less than 5% by weight, the film strength of the image portion during image recording is impaired, whereas an amount exceeding 70% by weight is undesirable in view of stability during storage.

Polymers having an aromatic hydrocarbon ring to which a hydroxy group or an alkoxy group is directly bonded at the side chain or main chain thereof are examples of the binder polymers of the invention used for the acid-crosslinkable layer. Alkoxy groups having 20 or less carbon atoms are preferable for sensitivity. A benzene ring, a naphthalene ring or an anthracene ring are preferable as the aromatic hydrocarbon ring in view of the availability of the raw material. These aromatic hydrocarbon rings may have a substituent other than a hydroxy group or an alkoxy group, such as a halogen group or a cyano group. However, it is unpreferable that they contain any substituent other than a hydroxy group or an alkoxy group in view of sensitivity.

Examples of the diazo resin (N-3) usable for the image forming layer include diazo resins represented by salts of condensates of diazodiarylamines and active carbonyl compounds, preferably those which are light-sensitive, water-insoluble and organic solvent-soluble.

Particularly preferable examples of the diazo resin include organic acid salts or inorganic acid salts of condensates of 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine or 4-diazo-3-methoxydiphenylamine and formaldehyde, paraformaldehyde, acetaldehyde, benzaldehyde or 4,4'-bis-methoxymethyldiphenyl ether.

Examples of the organic acid in this case include methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid and 2-hydroxy-4-methoxybenzophenone-5-sulfonic acid. Examples of the inorganic acid include hexafluorophosphoric acid, tetrafluoroboric acid and thiocyanic acid. Further examples that may be used are diazo resins whose main chain is a polyester group as described in JP-A No. 54-30121; diazo resins obtained by reacting a polymer having a carboxylic anhydride residue with a diazo compound having a hydroxyl group as described in JP-A No. 61-273538; and diazo resins obtained by reacting a polyisocyanate compound and a diazo compound having a hydroxyl group.

The amount of these diazo resins to be used preferably ranges from 0 to 40% by weight based on the solid of the composition. Two or more diazo resins may be used in combination as needed. Also, when preparing a negative type light-sensitive composition, a binder resin is usually jointly used. Examples of such a binder resin include acrylic resins, polyamide resins, polyester resins, epoxy resins, polyacetal resins, polystyrene resins and novolac resins.

Photo-crosslinking type resins having an affinity to an aqueous alkali developing solution are preferable for resin (N-4); For example, copolymers having a cinnamic acid group and a carboxyl group as described in Japanese Patent Publication JP-B No. 54-15711; polyester resins having a phenylenediacrylic acid residue and a carboxyl group as described in the publication of JP-A No. 60-165646; polyester resins having a phenylenediacrylic acid residue and a phenolic hydroxyl group as described in JP-A No. 60-203630; polyester resins having a phenylenediacrylic acid residue and a sodium iminodisulfonyl group as described in Japanese Patent Application Publication JP-B No. 57-42858; polymers having an azide group and a carboxyl group at the side chain as described in JP-A No. 59-208552; and polymers having a maleimide group at the side chain as described in JP-A No. 7-295212, may be used.

In this embodiment, an alkali-soluble binder and an acid generator are also used to improve film characteristics. The same materials that are used for the aforementioned positive type image forming layer, namely a compound having quinonediazide or an alkali-soluble group protected with an acid-decomposable group, may also be used as the binder and acid generator.

Acid (heat) crosslinkable compounds are compounds which crosslink in the presence of an acid. Examples of the acid (heat) crosslinkable compounds include aromatic compounds and heterocyclic compounds that are polysubstituted with a hydroxymethyl group, acetoxymethyl group, or an alkoxymethyl group. Among these compounds, preferable examples include compounds obtained by condensing phenols and aldehydes under basic conditions. Among the foregoing compounds, preferable examples include compounds obtained by condensing phenol and formaldehyde under a basic condition in the aforementioned manner, compounds obtained from m-cresol and formaldehyde in the same manner, compounds obtained from bisphenol A and formaldehyde, compounds obtained from 4,4'-bisphenol and formaldehyde, and compounds disclosed as resol resins in GB No. 2,082,339.

These acid-crosslinkable compounds are preferably those having a weight average molecular weight of 500 to 100,000 and a number average molecular weight of 200 to 50,000. Other preferable examples include aromatic compounds substituted with an alkoxymethyl or oxylanylmethyl group as disclosed in EP-A No. 0,212,482; monomer or oligomer melamine-formaldehyde condensates and urea-formaldehyde condensates as disclosed in EP-A No. 0,133,216, DE-A No. 3,634,671 and DE No. 3,711,264; and alkoxy-substituted compounds as disclosed in EP-A No. 0,212,482. Other preferable examples include melamine-formaldehyde derivatives having at least two free N-hydroxymethyl, N-alkoxymethyl or N-acyloxymethyl groups. Among these derivatives, N-alkoxymethyl derivatives are particularly preferable.

Low-molecular weight silanol and oligomer silanol may also be used as a silicon-containing crosslinking agent. Examples of the silanols include dimethyl- and diphenyl-silanediol and oligomers already pre-condensed and containing these units. For example, those disclosed in EP-A No. 0,377,155 may be used. Among the aromatic compounds and heterocyclic compounds which are polysubstituted with an alkoxymethyl group, preferable examples include compounds having an alkoxymethyl group at a position adjacent to a hydroxyl group, the alkoxy group of the alkoxymethyl group having 18 or less carbon atoms. As particularly preferable examples, compounds represented by the following formulae (B) to (E) are given.

General formula (B)

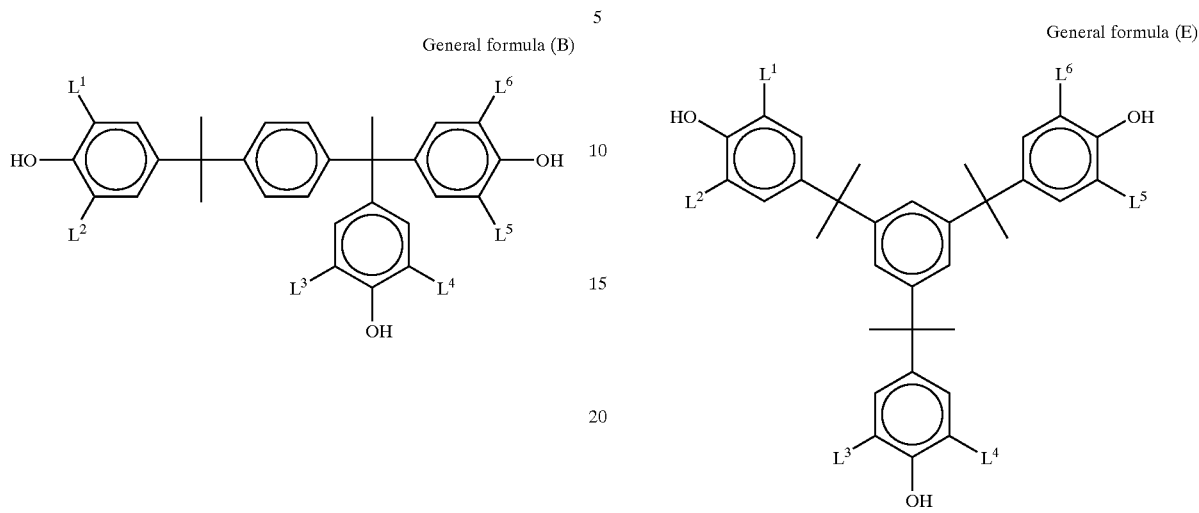

General formula (C)

General formula (D)

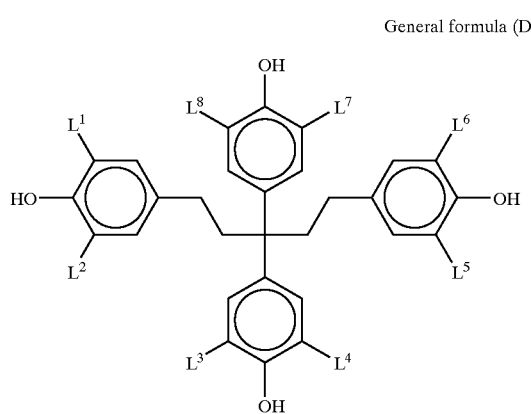

wherein $L^1$ to $L^8$ may be the same or different and respectively represent an alkoxymethyl group, such as methoxymethyl and ethoxydimethyl, substituted with an alkoxy group having 18 or less carbon atoms. These groups are preferable in that each has a high crosslinking efficient and that they can improve printing durability. The aforementioned compounds crosslinked by heating may be used either singly or in combinations of two or more. The acid-crosslinkable compound of the invention is to be used at an amount of 5 to 80% by weight, preferably 10 to 75% by weight, and even more preferably 20 to 70% by weight, based on the total solid of the image forming layer. When the amount of the acid-crosslinkable compound added is less than 5% by weight, the durability of the image forming layer of the resulting planographic printing plate is impaired, whereas an amount exceeding 80% by weight is undesirable for stability during storage.

As specific examples of the raw materials used for the aforementioned (N-5), those given previously as examples for the photopolymerization may be given. Many of the photopolymerization initiators are useful also as thermo-radical generators. Also, azobis compounds (azobisisobutyronitrile), diazonium compounds and the like may be used as the thermopolymerization initiator. The use of an addition-polymerizable compound group is also common. Any material is also acceptable as the light-heat converting agent as long as it absorbs the light of the exposure light source, and the entire dye group exemplified for the photopolymerization may therefore be used.

However, because a (near) infrared light source having a wavelength of 750 nm or more is primarily used as a practical high-output laser source for heat-mode exposure, compounds capable of absorbing (near) infrared light are most useful as the light-heat converting agent at present. Although various materials are available as IR absorbers, heptamethinecyanine dyes, phthalocyanines and carbon black are most preferably used.

Additives:

Known additives, as for example, thermopolymerization preventive agents, dyes, pigments, plasticizers and stability improvers may be further added to the aforementioned image forming layer to improve its performance.

Preferable examples of the dyes include basic oil-soluble dyes such as Crystal Violet, Malachite Green, Victoria Blue, Methylene Blue, Ethyl Violet and Rhodamine B. Examples of commercially available dye products include "Victoria Pure Blue BOH" (trade name, manufactured by Hodogaya Chemical Co., Ltd.) and "Oil Blue #603" (trade name, Orient Chemical Industries, Ltd.). Examples of the pigment include Phthalocyanine Blue, Phthalocyanine Green, Dioxazine Violet, Quinacridone Red.

Examples of the plasticizer are diethyl phthalate, dibutyl phthalate, dioctyl phthalate, tributyl phosphate, trioctyl phosphate, tricresyl phosphate, tri(2-chloroethyl) phosphate and tributyl citrate. Examples of known stability improvers are phosphoric acid, phosphorous acid, oxalic acid, tartaric acid, malic acid, citric acid, dipicolinic acid, polyacrylic acid, benzenesulfonic acid and toluenesulfonic acid. The stability improvers may be used in combination. The preferred amount of these various additives to be added generally ranges from 0 to 30% by weight based on the solid of the light-sensitive resin composition, though it differs according to the object.

Other various additives may be added to the composition of the invention according to the aim. Examples of these additives may include various resins having a hydrophobic group, which are used to improve the ink-densifying ability of an image such as octylphenol/formaldehyde resins, t-butylphenol/formaldehyde resins, t-butylphenol/benzaldehyde resins, rosin-modified novolac resins and o-naphthoquinone diazidosulfonates of these modified novolac resins; and plasticizers such as dibutylphthalate, dioctylphthalate, butylglycolate, tricresyl phosphate and dioctyl adipate, which are used to improve the flexibility of te coated film. The amount of these additives to be added is preferably 0.01 to 30% by weight based on the total weight of the composition.

Known resins may also be added to the composition to more improve the wear resistance of the film. Examples of these resins include polyvinylacetal resins, polyurethane resins, epoxy resins, vinyl chloride resins, nylon, polyester resins and acrylic resins. These resins may be used either singly or in a mixture. The amount of these resins to be added preferably ranges from 2 to 40% by weight based on the total weight of the composition.

Also, nonionic surfactants as described in JP-A Nos. 62-251740 and 4-68355 and amphoteric surfactants as described in the publication of JP-A Nos. 59-121044 and 4-13149 may be added to the composition for the image forming layer of the invention to widen the latitude of developing. Specific examples of the nonionic surfactants include sorbitan tristearate, sorbitan monopalmitate, sorbitan triorate, stearic acid monoglyceride, polyoxyethylenesorbitan monoorate and polyoxyethylene nonylphenyl ether. Specific examples of the amphoteric surfactant include alkyldi(aminoethyl)glycine, alkylpolyaminoethylglycine hydrochloride, Amorgen K (trade name, manufactured by Dai-ichi Kogyo Seiyaku Co., Ltd., N-tetradecyl-N,N-betaine type), 2-alkyl-N-carboxyethyl-N-hydroxyethylimidazoliniumbetaine, Lebon 15 (trade name, manufactured by Sanyo Chemical Industries, Ltd., alkylimidazoline type). The proportion occupied by the above nonionic surfactants and amphoteric surfactants in the light-sensitive resin composition is preferably 0.05 to 15% by weight, and more preferably 0.1 to 5% by weight.

A surfactant for improving the quality of the coated surface, as for example, a fluorine type surfactant as described in JP-A No. 62-170950, may be added to the composition. The amount of the surfactant added is preferably 0.001 to 1.0% by weight, and more preferably 0.005 to 0.5% by weight, based on the total light-sensitive resin composition.

Also, a yellow dye, preferably having the characteristic that its amount of absorbance at 417 nm is 70% or more than that at 436 nm, may be added to the light-sensitive composition of the invention.

Formation of an Image Forming Layer:

For planographic printing plate precursor of the invention, the foregoing resin composition may be applied to a suitable support and dried to form an image forming layer. The fluorine macromolecular compound-containing composition is dissolved or dispersed in a single organic solvent or a mixture of organic solvents described below and applied to a support and dried. A solvent having a boiling point ranging from 40° C. to 200° C., and particularly from 60° C. to 160° C. may be selected for the organic solvent for an advantage in drying, though any known and conventional solvent may be used. Naturally, it is good to select an organic solvent in which the surfactant of the invention can be dissolved.

The following organic solvents are preferably used. They may be used either singly or in a mixture. Examples include alcohols such as methyl alcohol, ethyl alcohol, n- or iso-propyl alcohol, n- or iso-butyl alcohol and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone and acetylacetone; hydrocarbons such as benzene, toluene, xylene, cyclohexane and methoxybenzene; acetates such as ethyl acetate, n- or iso-propyl acetate, n- or iso-butyl acetate, ethylbutyl acetate and hexyl acetate; halides such as methylene dichloride, ethylene dichloride and monochlorobenzene; and ethers such as isopropyl ether, n-butyl ether, dioxane, dimethyldioxane and tetrahydrofuran; polyhydric alcohols such as ethylene glycol, methyl cellosolve, methyl cellosolve acetate, ethyl cellosolve, diethyl cellosolve, cellosolve acetate, butyl cellosolve, butyl cellosolve acetate, methoxymethoxy ethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether and 3-methyl-3-methoxybutanol and the derivatives of the above polyhydric alcohols, and specific solvents such as dimethyl sulfoxide and N,N-dimethylformamide.

The concentration of the solid in the coating solution is appropriate at 2 to 50% by weight.

In the invention, such methods for applying the composition as roll coating, dip coating, air knife coating, gravure coating, gravure offset coating, hopper coating, blade coating, wire doctor coating and spray coating are used. The weight of the composition after drying is preferably 0.3 to 4.0 g/m². Although with a decreased coated amount only a small exposure amount is required to obtain an image, film strength is lowered. With an increased coated amount, a larger exposure amount is required, but the light-sensitive film is more strengthened. When the composition is used for a printing plate, for example, it is possible to obtain one that produces a large number of print copies (high printing durability).

The light-sensitive composition applied to the support is generally dried by heated air. Heating is preferably carried out at a temperature from 30° C. to 200° C. and particularly 40° C. to 140° C. For the drying temperature, a method by which the drying temperature is kept constant and also a method by which it is raised in stages can be implemented. Also, a good result can be obtained by dehumidifying the heated air. The heated air is preferably provided on the coated surface at a rate of 0.1 m/sec to 30 m/sec, and particularly at a rate of 0.5 m/sec to 20 m/sec.

Mat Layer:

A mat layer is preferably provided on the surface of the light-sensitive layer formed in the above manner to shorten the time required for evacuation by contact exposure using a vacuum printing frame, and to prevent burning failures. Specific examples of methods for providing the mat layer include a method as described in publications of JP-A No. 50-125805, JP-B Nos. 57-6582 and 61-28986, and a method in which a solid powder is thermo-fused as described in JP-B No. 62-62337.

Support:

Supports for the planographic printing plate precursor of the invention preferably includes dimensionally stable plate materials, and those supports that have already been implemented for printing plates. Examples of such support materials include paper, paper laminated with plastic (e.g., polyethylene, polypropylene and polystyrene); metal plates such as aluminum (including an aluminum alloy); zinc, iron and copper; plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinylacetal; and paper or plastic films on which metals, like those mentioned above, are laminated or deposited. Aluminum plates are particularly preferable. The aluminum plates include pure aluminum plates and aluminum alloy plates, and for the aluminum alloy, various materials may be used. For example, alloys of aluminum and a metal such as silicon, copper, manganese, magnesium, chromium, zinc, lead, bismuth or nickel can be used. These compositions contain a certain amount of iron and titanium, and a negligible amount of impurities.

The support is to be surface-treated as required. For example, for a light-sensitive planographic printing plate, the surface made hydrophilic. For supports with the surfaces formed by a metal, particularly aluminum, surface treatments such as pebbling or dipping the support in an aqueous solution of sodium silicate, potassium fluorozirconate or a phosphate, and anodic oxidation treatment are preferably implemented. Also dipping the aluminum plate in an aqueous sodium silicate solution after pebbling as described in the specification of U.S. Pat. No. 2,714,066, and dipping the aluminum plate in an aqueous solution of alkali metal silicate after anodic oxidation treatment as described in the specification of U.S. Pat. No. 3,181,461. The foregoing anodic oxidation treatment is carried out by flowing a current with the aluminum plate as the anode in an electrolyte of an aqueous solution or non-aqueous solution, using singly or in combinations of two or more of inorganic acids such as phosphoric acid, chromic acid, sulfuric acid and boric acid, or organic acids such as oxalic acid and sulfamic acid, or salts of these acids.

Silicate electrodeposition as described in the specification of U.S. Pat. No. 3,658,662 is also effective. These hydrophilic treatments not only make the surface of the support hydrophilic, but also are useful in preventing a harmful reaction with the composition formed thereon, and in improving the adhesion between the support and the image forming layer.

Prior to pebbling the aluminum plate, removal of surface roll oil, and pretreating to expose the aluminum surface may be carried out as needed. For the former, a solvent such as trichlene or a surfactant is used. For the latter, a method using an alkali etchant such as sodium hydroxide or potassium hydroxide is widely prepared.

Any of the mechanical, chemical or electrochemical methods is effective for pebbling. Examples of mechanical methods include a ball abrasive method, a blast abrasive method and a brush abrasive method in which a water dispersion slurry of an abrasive material such as pumice is rubbed against the surface by using a nylon brush. For the chemical method, one in which the aluminum plate is dipped in an aqueous saturated solution of an aluminum salt of a mineral acid as disclosed in publication JP-A No. 54-31187 is suitable. For the electrochemical method, one in which the surface of the aluminum plate is electrolyzed using an AC current in an acidic electrolyte of hydrochloric acid, nitric acid, or a combination of these acids is preferable. Among these surface roughing methods, a combination of a mechanical and an electrochemical surface roughing method as described in JP-A No. 55-137993 is particularly desirable for strong adhesion of the fat-sensitive image to the support. Pebbling by such methods as above is preferably carried out so that the surface roughness (Ra) at the centerline of the surface of the aluminum plate falls in a range from 0.3 to 1.0 $\mu$m. Aluminum plates pebbled in this manner are washed with water and chemically etched as required.

Etchants are usually selected from aqueous solutions of bases or acids which dissolve aluminum. It is necessary for the etchant not to be of a kind by which a film differing from that of aluminum is formed. Preferable examples of the etchant include basic materials such as sodium hydroxide, potassium hydroxide, trisodium phosphate, disodium phosphate, tripotassium phosphate and dipotassium phosphate; and acidic materials such as sulfuric acid, persulfuric acid, phosphoric acid, hydrochloric acid, and the salts of these acids.

The etching is carried out by dipping the aluminum plate in the foregoing etchant or by applying the etchant to the aluminum plate, wherein the etching treatment is preferably carried out such that the amount of etching is 0.5 to 10 g/m². An aqueous basic solution is desirably used as the etching agent because of its high etching rate characteristic. Because smutting occurs, the aluminum plate is usually subjected to desmutted. Examples of the acid used for the desmutting include nitric acid, sulfuric acid, phosphoric acid, chromic acid, hydrofluoric acid and borohydrofluoric acid.

The etched aluminum plate is washed with water and subjected to anodic oxidation as required. Anodic oxidation may be carried out by a method employed in the field. Specifically, when flowing a DC or AC current through aluminum in an aqueous or non-aqueous solution containing sulfuric acid, phosphoric acid, chromic acid, oxalic acid, sulfamic acid, benzenesulfonic acid or a combination of two or more of these acids, an anodic oxidation film can be formed on the surface of the aluminum support.

The appropriate treating conditions for anodic oxidation are as follows, though they cannot be specified, because they differ depending on the type of electrolyte. Generally, the concentration of the electrolyte is to be between 1 to 80% by weight; the solution temperature 5 to 70° C.; the current density 0.5 to 60 A/dm$^2$; the voltage 1 to 100 V; and electrolytic time 30 seconds to 50 minutes.

The aluminum plate, surface-roughened and processed by anodic oxidation in the above manner, may be made to hydrophilic as required. A preferable example method is one in which the aluminum plate is made hydrophilic by using an alkali metal silicate such as an aqueous sodium silicate solution, potassium fluorozirconate or polyvinylphosphonic acid.

Organic Undercoat Layer:

The planographic printing plate precursor of the invention is preferably provided with an organic undercoat layer before forming the light-sensitive layer to reduce the residual light-sensitive layer in the non-image portion. Examples of the organic compound used for the organic undercoat layer are phosphonic acids having an amino group such as carboxymethyl cellulose, dextrin, gum arabic and 2-aminoethylphosphonic acid; organic phosphonic acids such as phenylphosphonic acid, naphthylphosphonic acid, alkylphosphonic acid, glycerophosphonic acid, methylenediphosphonic acid and ethylenediphosphonic acid, all of which may have a substituent; organic phosphoric acids such as phenylphosphoric acid, naphthylphosphoric acid, alkylphosphoric acid and glycerophosphoric acid, all of which may have a substituent; organic phosphinic acids such as phenylphosphinic acid, naphthylphosphinic acid, alkylphosphinic acid and glycerophosphinic acid, all of which may have a substituent; amino acids such as glycine and β-alanine; and hydrochlorides of amine having a hydroxyl group such as hydrochlorides of triethanolamine. These compounds may be used in a mixture.

Backcoat Layer:

A backcoat layer can be formed on the back of the support as required. A coating layer comprising a metal oxide obtained by hydrolyzing or polycondensing an organic macromolecular compound as described in JP-A No. 5-45885 or an organic or inorganic metal compound as described in JP-A No. 6-35174 is preferably used as the backcoat. Among these coating layers, those comprising a metal oxide obtained from alkoxy compounds of silicon such as Si (OCH$_3$) 4, Si (OCH$_2$H$_5$) 4, Si (OC$_3$H$_7$) 4 and Si (OC$_4$H$_9$)$_4$ are particularly preferable because these alkoxy compounds are inexpensive and easily available, and the coating layer of a metal oxide obtained therefrom is superior in its resistance to the developing solution.

Exposure:

The planographic printing plate formed in the above manner is generally image exposed and developed. Examples of active ray light sources used for image exposure include a mercury lamp, a metal halide lamp, a xenon lamp, a chemical lamp and a carbon arc lamp. Examples of radial rays include an electron ray, an X-ray, an ion beam and far infrared radiation. Also, g rays, i rays, Deep-UV light, and a high-density energy beam (laser beam) are used. Examples of the laser beam include a helium-neon laser, an argon laser, a krypton laser, a helium-cadmium laser and a KrF excimer laser. Also, in the case of a laser-direct-print type printing plate, a light source having an emission wavelength in the near infrared region to the infrared region is preferable, and a solid laser and a semiconductor laser are even more preferable.

A preferable developing solution is one which is (a) at least one type of sugars selected from nonreducing sugar and (b) contains at least one base and has a pH ranging from 9.0 to 13.5. A detailed explanation of the developing solution follows. For this specification, unless otherwise specified, the term developing solution means a development-initiating solution (developing solution in a narrow sense) or a developing replenishing solution.

This developing solution preferably comprises at least one compound selected from nonreducing sugars and at least one base as its major components and has a solution pH ranging from 9.0 to 13.5. Such nonreducing sugars are sugars which have neither a free aldehyde group nor a free ketone group, and exhibit no reducibility. Nonreducing sugars are classified into trehalose type oligosaccharides in which reducing groups are bonded among them, glycosides, in which a reducing group of sugars is bonded to non-sugars, and sugar alcohol obtained by reducing sugars by adding hydrogen. All of these sugars are preferably used. Examples of the trehalose type oligosaccharides include saccharose and trehalose. Examples of the glycosides include an alkyl glycoside, a phenol glycoside and a mustard oil glycoside. Also, examples of the sugar alcohol include D, L-arabitol, ribitol, xylitol, D,L-sorbitol, D,L-mannitol, D,L-iditol, D,L-talitol, dulicitol and allodulcitol. Moreover, maltitol obtained by hydrogenating disaccharide and a glycoside (reducing starch syrup) obtained by hydrogenating oligosaccharide are preferably used. Particularly preferable nonreducing sugars among the above are sugar alcohol and saccharose, and especially D-sorbitol, saccharose and reducing starch syrup for their buffer action in moderate pH ranges, and because they are low in cost.

These nonreducing sugars may be used either singly or in combinations of two or more. The proportion of these sugars in the developing solution is preferably 0.1 to 30% by weight and more preferably 1 to 20% by weight.

When the proportion is lower than the above range, only an insufficient buffer action is obtained, whereas when the proportion is higher than this range, it is difficult to obtain a highly concentrated solution and also the price goes up. It is to be noted that when reducing sugar and a base are used in combination, the sugar changes color to brown with time and the pH gradually reduces, posing the problem of a lowered developing ability.

Conventionally known alkali agents may be used as the base to be combined with the nonreducing sugar. Examples of these alkali agents include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium bicarbonate, potassium bicarbonate, ammonium bicarbonate, sodium borate, potassium borate and ammonium borate. Organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine can also be used.

These alkali agents may be used either singly or in combinations of two or more. Among these agents, sodium hydroxide and potassium hydroxide are preferable. This is because pH adjustment becomes possible for a wide pH range by controlling the amounts of these agents in comparison to the nonreducing sugar. Trisodium phosphate, tripotassium phosphate, sodium carbonate, potassium carbonate and the like are also preferable because each of these compounds itself provides a buffer action. These alkali agents are added to bring the pH of the developing solution to a range of 9.0 to 13.5. Although the amount of these alkali agents to be added is determined according to the desired pH and the type and amount of the nonreducing agent, preference is given to a pH range of 10.0 to 13.2.

A non-sugar alkaline buffer solution consisting of a weak acid and a strong base may combined in the developing solution. Weak acids having a dissociation constant (pKa) of 10.0 to 13.2 are preferable for use in this case.

Among these weak acids, sulfosalicylic acid and salicylic acid are preferable. Sodium hydroxide, ammonium hydroxide, potassium hydroxide and lithium hydroxide are preferably used as the base combined with these weak acids. These alkali agents are used either singly or in combinations of two or more. The aforementioned various alkali agents are to be used for adjusting the pH in a desirable range by regulating the concentrations and combinations.

Various surfactants and organic solvents may be added to the developing solution as required for promoting developing ability, dispersing developing residues, and enhancing the affinity of the image portion of the printing plate to ink. Preferable examples of the surfactant include anionic, cationic, nonionic and amphoteric surfactants. Among these surfactants, a fluorine type surfactant containing a perfluoroalkyl group in a molecule is preferable.

The above surfactants may be used either singly or in combinations of two or more, and are to be added at an amount ranging from 0.001 to 10% by weight, and more preferably 0.01 to 5% by weight, in the developing solution.

Known developing stabilizers, organic solvents, reducing agents for preventing the contamination of the printing plate, organic carboxylic acids, antiseptics, colorants, thickeners, antifoaming agents and water softeners may be compounded in the developing solution as required. The content of the organic solvent is to be 0.1 to 5% by weight based on the total weight of the working solution.

For the developing solution, one described in JP-A No. 6-282079 may also be used. This developing solution contains a water-soluble ethylene oxide addition compound obtained by adding 5 mols or more of ethylene oxide to 4 or more hydroxyl groups and a sugar alcohol containing an alkali metal silicate in which the molar ratio of silicon oxide $SiO_2$ to alkali metal oxide $M_2O$ is 0.5 to 2.0. The sugar alcohol is a polyhydric alcohol corresponding to an alcohol in which an aldehyde group and ketone group in a sugar are converted into a first and a second alcohol group respectively by reducing these groups. Specific examples of the sugar alcohol include D,L-threitol, erythritol, D,L-arabitol, ribitol, xylitol, D,L-sorbitol, D,L-mannitol, D,L-iditol, D,L-talitol, dulicitol and allodulcitol, and also include di-, tri-, tetra-, penta- and hexaglycerol obtained by condensing sugar alcohols. The above water-soluble ethylene oxide addition compound is obtained by adding 5 mol or more of ethylene oxide per mol of the above sugar alcohol. Further, propylene oxide may be block-copolymerized with the ethylene oxide addition compound as required within the limits of solubility. These ethylene oxide addition compounds may be used either singly or in combinations of two or more. The amount of these water-soluble ethylene oxide addition compounds to be added is appropriately 0.001 to 5% by weight, and more preferably 0.001 to 2% by weight, based on the developing solution (working solution).

The various aforementioned surfactants and organic solvents may be added to this developing solution as required for promoting developing ability, dispersing developing residues, and enhancing the affinity of the image portion of the printing plate to ink.

The developing solution of the above composition is subjected to an after-treatment carried out by rinsing water, a rinsing solution containing surfactants and the like, and a finisher or a protective gum solution containing gum arabic and a starch derivative as its major components. After-treatments may be used in various combinations.

Due to the rationalization and standardization of the plate-making and printing fields in recent years, an automatic developing machine for PS plates has become widely used. This automatic developing machine generally consists of a developing section and an after-treating section, comprising a unit for conveying the PS plate, developing tanks for each processing solution, and spraying units. The processing solution is pumped up and sprayed out from a spray nozzle as the exposed PS plate is being conveyed horizontally to carry out developing treatment and after-treatment. Recently known methods are one in which the PS plate is conveyed by a guide roll placed within the processing solution of the processing solution vessel (developing tank) and immersed, and another in which after developing, a small constant amount of rinsing water is provided on the surface of the plate to wash it, and the waste water is then reused for diluting the raw solution of the developing solution.

Such automatic can incorporate processing a replenishing solution for each processing solution during plate treatment that replenishes periodically according to output and operating time. Also, a so-called non-reusable system may be applied in which treatment is carried out using a substantially unused process solution. The planographic printing plate obtained by such treatments is placed in an offset printer for printing a number of copies.

EXAMPLES

The invention will be further explained by way of examples. The invention, however, is not intended to be limited to these examples.

Examples 1 to 6 and Comparative Examples 1 to 3:

In the following examples, the designation of "%" indicates "weight percentage (wt. %)", unless otherwise specified.

Production of a Support:

A 0.24-mm-thick aluminum alloy plate (containing 99.5% or more of aluminum, 0.30% of Fe, 0.10% of Si, 0.02% of Ti and 0.013% of Cu) was brush grained using a rotating nylon brush described below while being disposed to supplying water and a suspension consisting of pumice stone having an average particle diameter of about 2.1 $\mu$m. The first brush had a hair length of 100 mm, a hair diameter of 0.95 mm and a flocked density of 70/cm$^2$, and the second brush had a hair length of 80 mm, a hair diameter of 0.295 mm and a flocked density of 670/cm$^2$. The brush rolls were each rotated at 250 rpm. The aluminum plate was thoroughly washed with water after brush graining, and then dipped in 10% sodium hydroxide at 60° C. for 25 seconds for etching. The plate was then washed with flowing water, and again afterforward with 20% nitric acid for neutralization, and washed with water. The resulting plate was electrolytic surface roughened by using a sinusoidal alternating waveform current in an aqueous 1% nitric acid solution with the VA at 12.7 V and the quantity of electricity at anodic time at 160 coulomb/dm$^2$. The surface roughness of the plate was measured at 0.79 $\mu$m (Ra indication). The plate was successively dipped in an aqueous 1% sodium hydroxide solution at 40° C. for 30 seconds, and in an aqueous 30% sulfuric acid solution, and was desmutted at 60° C. for 40 seconds. The plate was then subjected to anodic oxidation using DC current in an aqueous 20% sulfuric acid solution at a current density of 2 A/dm² to produce an oxidized film at 1.6 g/m² weight. The substrate was thus prepared.

An undercoating solution (A) having the following composition was applied to the surface of the substrate prepared in the above manner and dried at 80° C. for 30 seconds. The amount of the coating after drying was 10 mg/m².

Composition of the Undercoating Solution (A):

| β-alanine | 0.10 g |
|---|---|
| Methanol | 40 g |
| Pure water | 60 g |

The support was produced in this manner.

Formation of an Image Forming Layer:

Next, 12 ml/m² of an image forming layer coating solution composition 1 described below was rod coated on this support and dried at 100° C. for one minute to obtain a positive type light-sensitive planographic printing plate precursor. The amount of the coating after drying was 1.15 g/m².

Further, a matt layer was formed in the manner described in JP-B No. 61-28986 to shorten vacuum contact time.

Composition of the Image Forming Layer Coating Solution Composition 1:

| | |
|---|---|
| Esterified product of 1,2-diazonaphthoquinone-5-sulfonyl chloride and a pyrogallol-acetone resin (an example of which is described in Example 1 in the specification of U.S. Pat. No. 3,635,709) | 0.8 g |
| Cresol-formaldehyde novolac resin (metha/para ratio: 6:4, weight average molecular weight: 8000) | 1.5 g |
| Phenol-formaldehyde resin (weight average molecular weight 15,000) | 0.3 g |
| Poly[N-(p-aminosulfonylphenyl)acrylamide-normalbutylacrylate-diethylene glycol monomethyl ether methacrylate (molar ratio among monomers (40:40:20), weight average molecular weight 40,000, number average molecular weight 20,000) | 0.2 g |
| p-Normaloctylphenol-formaldehyde resin (an example of which is described in the specification of U.S. Pat. No. 4,123,279) | 0.02 g |
| Naphthoquinonediazido-1,2-diazido-4-sulfonic acid chloride | 0.01 g |
| Tetrahydrophthalic anhydride | 0.02 g |
| Pyrogallol | 0.05 g |
| 4-[p-N,N-bis(ethoxycarbonylmethyl)aminophenyl]-2,6-bis(trichloromethyl)-s-triazine | 0.07 g |
| Dye prepared by changing the counter anion of Victoria Pure Blue BOH (manufactured by Hodogaya Chemical Co., Ltd.) to 1-naphthalenesulfonic acid | 0.045 g |
| Fluorine macromolecular compound (compound indicated in Table 4) | Amount indicated in Table 4 |
| Methyl ethyl ketone | 15 g |
| 1-Methoxy-2-propanol | 10 g |

TABLE 4

| | Fluorine macromolecular compound | Amount to be added (converted into a fluorine macromolecular compound solid: g) |
|---|---|---|
| Sensitive material 1 (product of the invention) | P-1 | 0.03 g |

TABLE 4-continued

| | Fluorine macromolecular compound | Amount to be added (converted into a fluorine macromolecular compound solid: g) |
|---|---|---|
| Sensitive material 2 (product of the invention) | P-9 | 0.02 g |
| Sensitive material 3 (product of the invention) | P-23 | 0.1 g |
| Sensitive material 4 (product of the invention) | P-25 | 0.01 g |
| Sensitive material 5 (product of the invention) | P-42 | 0.01 g |
| Sensitive material 6 (product of the invention) | P-57 | 0.06 g |
| Sensitive material 1 (comparative product) | R-1 (Structure shown below) | 0.01 g |
| Sensitive material 2 (comparative product) | R-2 (Structure shown below) | 0.01 g |
| Sensitive material 3 (comparative product) | Not added | None |

R-1
Mw 15,000

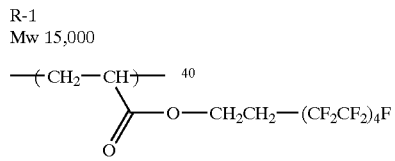

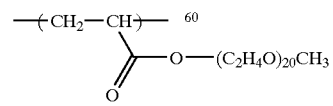

R-2
Mw 15,000

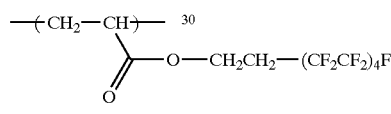

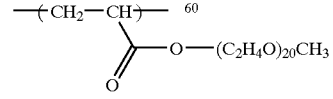

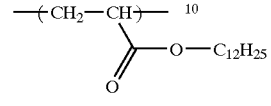

Evaluation of Foaming Characteristics

Each image forming layer coating solution obtained above was shaken vigorously in a bottle to observe the foaming characteristics.

The Foaming Characteristics were Rated as Follows:

A case where foaming was significant and the foam did not disappear even if 30 minutes passed after the sample was allowed to stand was rated as "X".

A case where the foam disappeared within 20 minutes after the sample was allowed to stand though foaming was significant was rated as "○".

A case where foaming was poor and the foam disappeared within 5 minutes after the sample was allowed to stand was rated as "⊚".

Condition of the Coated Surface of the Image Forming Layer:

The surface condition of the coated surface of the image forming layer formed on the support was visually observed.

The surface condition was indicated by the number of pinholes generated per square meter.

The results of these evaluations are shown in Table 5.

TABLE 5

|  | Sensitive material | Foaming characteristics | Coated surface condition |
| --- | --- | --- | --- |
| Example 1 | Sensitive material 1 | ○ | 5 or less |
| Example 2 | Sensitive material 2 | ○ | 5 or less |
| Example 3 | Sensitive material 3 | ○ | 5 to 10 |
| Example 4 | Sensitive material 4 | ⊚ | 5 or less |
| Example 5 | Sensitive material 5 | ⊚ | 5 or less |
| Example 6 | Sensitive material 6 | ⊚ | 5 or less |
| Comparative Example 1 | Sensitive material R1 | X | 20 or more |
| Comparative Example 2 | Sensitive material R2 | X | 20 or more |
| Comparative Example 3 | Sensitive material R3 | ○ | Uneven and non-uniform film on the entire surface |

As is clear from Table 5, all the image forming layer coating solutions using the fluorine macromolecular compound according to the invention show little-foaming and a high defoaming ability and therefore a plate precursor with an excellently uniform image forming layer could be obtained.

Examples 7 to 11 and Comparative Examples 4 and 5

Sensitive materials 7 to 11, R3 and R4 were produced as planographic printing plate precursor in the same manner as in Example 1 except that the fluorine macromolecular compound was altered to those shown in Table 6 described below.

TABLE 6

|  | Fluorine macromolecular compound | Amount to be added (converted into a fluorine macromolecular compound solid: g) |
| --- | --- | --- |
| Sensitive material 7 (product of the invention) | P-6 | 0.02 g |
| Sensitive material 8 (product of the invention) | P-12 | 0.04 g |
| Sensitive material 9 (product of the invention) | P-54 | 0.05 g |
| Sensitive material 10 (product of the invention) | P-39 | 0.01 g |
| Sensitive material 11 (product of the invention) | P-47 | 0.02 g |
| Sensitive material R4 (comparative product) | R-3 (Structure shown below) | 0.01 g |
| Sensitive material R5 (comparative product) | R-4 (Structure shown below) | 0.01 g |

R-3
Mw 6,000

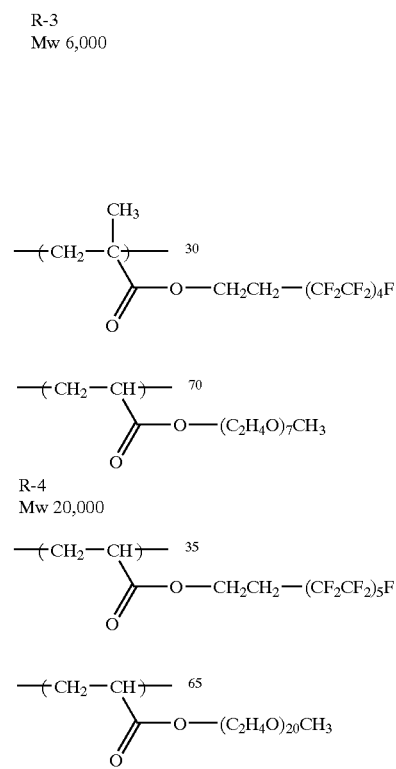

R-4
Mw 20,000

Evaluation of the Planographic Printing Plate Precursor

Densifying Characteristics:

The light-sensitive planographic printing plate precursors produced in this manner were evaluated according to the following method. Each plate was exposed to a 3 kW metal halide lamp from a distance of 1.5 m for one minute through an original copy consisting of a solid and dot pattern. Then, the master plate was developed at 30° C. for 12 seconds by using a developing machine (manufactured by Fuji Photo Film Co., Ltd., trade name: PS processor 900V) in which a developing solution (described below) and a finisher (manufactured by Fuji Photo Film Co., Ltd., trade name: FP2W (1:1)) were placed to produce a planographic printing plate. Then, using a printer (manufactured by Roland, trade name: R201) and an ink (manufactured by Dainippon Ink and Chemicals, Incorporated, trade name: GEOS-G(N)), printing was carried out to examine the number of copies it took until a sufficient ink density was obtained on the image portion at the start of printing to finding the adhering number of copies. The smaller the figure, therefore, the better the planographic printing plate.

Printing Durability:

Printing was carried out until the solid portion of the print product started to be blur to find the number of the copies it took until this occurred, to thereby evaluate the printing durability. The larger the number of copies, therefore the more excellent the planographic printing plate.

The Generation of Sludge in the Developing Solution:

1 m² each of the planographic printing plate precursors was wholly exposed separately. The precursors were then treated using 100 ml of a developing solution, and the generation of sludge in the developing solution after plate treatment was visually observed.

The results are shown in Table 7 below.

Composition of the Developing Solution

| | | |
|---|---|---|
| Pure water | 90% by weight | |
| D-sorbitol | 6% by weight | |
| KOH | 2.5% by weight | |

TABLE 7

| | Sensitive material | Densifying number of copies | Number of copies for printing durability | Generation of sludge |
|---|---|---|---|---|
| Example 7 | Sensitive material 7 | 12 | 170,000 | None |
| Example 8 | Sensitive material 8 | 14 | 140,000 | None |
| Example 9 | Sensitive material 9 | 10 | 180,000 | None |
| Example 10 | Sensitive material 10 | 13 | 150,000 | None |
| Example 11 | Sensitive material 11 | 17 | 160,000 | None |
| Comparative Example 4 | Sensitive material R4 | 25 | 120,000 | Generated, unpractical |
| Comparative Example 5 | Sensitive material R5 | 30 | 100,000 | Generated, unpractical |

As is clear from Table 7, the planographic printing plate precursor of the invention provides an excellent planographic printing plate combining adhering and printing durability characteristics with the prevention of the generation of sludge. Specifically, the planographic printing plate precursor of the invention exhibits high adhering characteristics and printing durability due to its high hydrophobicity, and it also maintains excellent solubility and dispersibility in a developing solution.

Examples 12 to 14 and Comparative Examples 6

The fluorine macromolecular compound was altered to those shown in Table 8 and other conditions were the same as those in the production of the sensitive material 1 to produce sensitive materials 12 to 14 and R6 as planographic printing plate precursors.

TABLE 8

| | Fluorine macromolecular compound | Amount to be added (converted into a fluorine macromolecular compound solid: g) |
|---|---|---|
| Sensitive material 12 (product of the invention) | P-55 | 0.01 g |
| Sensitive material 13 (product of the invention) | P-58 | 0.05 g |

TABLE 8-continued

| | Fluorine macromolecular compound | Amount to be added (converted into a fluorine macromolecular compound solid: g) |
|---|---|---|
| Sensitive material 14 (product of the invention) | P-60 | 0.1 g |
| Sensitive material R6 (comparative product) | R-5 (Structure shown below) | 0.1 g |

R-5
Mw 12,000

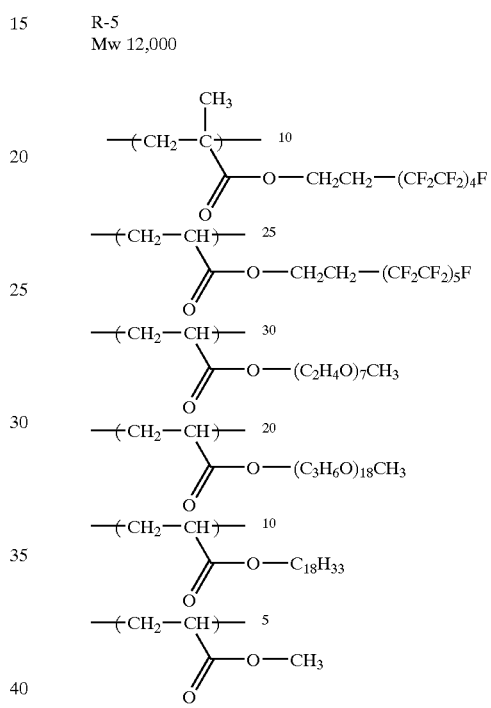

Evalation of the Planographic Printing Plate Precursor

Recording Sensitivity:

The light-sensitive planographic printing plate precursor produced in this manner was evaluated according to the following methods. For sensitivity, the planographic printing plate precursor was exposed to a 3 kW metal halide lamp from a distance of 1 m for one minute through a step wedge (difference in concentration between each stage: 0.15) manufactured by Fuji Photo Film Co., Ltd. The master plate was then developed using a developing machine (manufactured by Fuji Photo Film Co., Ltd., trade name: PS processor 900V) at 30° C. for 12 seconds in an aqueous solution in which the molar ratio of $SiO_2/K_2O$ was 1.16 and the concentration of $SiO_2$ was 1.4%, to find the number of clear stages to indicate sensitivity. The higher the number of the stages, the higher the sensitivity.

Gradation:

The gradation was indicated by the difference between the number of clear stages and the number of solid stages obtained in the above evaluation of the sensitivity of the sample. The lower the value, the higher the contrast shown. As for developing allowance, the same exposure and developing as for determining sensitivity were carried out except that a solution based of the aforementioned developing solution was increased and decreased in pH by 0.2 to indicate the developing allowance by a change in the number of solid stages in relation to the pH. A smaller value indicated that the developing allowance was better. The results of these evaluations are shown in Table 9.

TABLE 9

|  | Sensitive material | Sensitivity | Gradation | Developing allowance |
|---|---|---|---|---|
| Example 12 | Sensitive material 12 | 6.0 | 5.5 | 5 |
| Example 13 | Sensitive material 13 | 5.75 | 4.5 | 6 |
| Example 14 | Sensitive material 14 | 6.0 | 4.5 | 5 |
| Comparative Example 6 | Sensitive material R6 | 6.0 | 6.5 | 7 |

As is clear from Table 9, each planographic printing material plate produced in Examples 12 to 14 attains a high contrast and good developing allowance without any decrease in sensitivity.

Examples 15, Comparative Examples 7 and 8:

Production of a Support:

The surface of a 0.30-mm-thick aluminum plate was pebbled using a No. 8 nylon brush and a water suspension containing 800 mesh pumice stone, and then thoroughly washed with water. The aluminum plate was then dipped in 10% sodium hydroxide at 70° C. for 60 seconds to carry out etching. Thereafter, the plate was washed with flowing water, then washed with 20% $HNO_3$ for neutralization, and again washed with water. The resulting plate was subjected to electrolytic surface roughing using a sinusoidal alternating wave form current in an aqueous 1% nitric acid solution with the VA at 12.7 V and the quantity of electricity at anodic time at 300 coulomb/$dM^2$. The surface roughness of the plate was measured at 0.45 $\mu$m (Ra indication). The plate was then dipped in an aqueous 30% $H_2SO_4$ solution to carry out desmutting at 55° C. for 2 minutes, and subjected to anodic oxidation at 33° C. in an aqueous 20% $H_2SO_4$ solution at a current density of 5 A/$dm^2$ for 50 seconds by disposing the negative electrode on the pebbled surface. The) thickness of the anodic oxidation film was 2.7 g/$m^2$.

Further, the plate was dipped in a 70° C. aqueous solution containing 2.5% by weight of No. 3 sodium silicate ($SiO_2$= 28 to 30%, $Na_2O$=9 to 10%, Fe=0.02% or less) and having a pH of 11.2 for 13 seconds, and then washed with water. The amount of the silicate at this time was 10 mg/$m^2$. The amount of Si element was found by X-ray fluorescence analysis. Next, a liquid composition (sol solution) was prepared by an SG method. Specifically, the following components were weighed and placed in a beaker. The mixture of these components was stirred at 25° C. for 20 minutes.

| | |
|---|---|
| $Si(OC_2H_5)_4$ | 38 g |
| 3-Methacryloxypropyltrimethoxysilane | 13 g |
| Aqueous 85% phosphoric acid solution | 12 g |
| Ion exchange water | 15 g |
| Methanol | 100 g |

The resulting solution was transferred to a flask with three necks, equipped with a reflux condenser, and the three-neck flask was soaked in an oil bath kept at ambient temperature. The content in the three-neck flask was raised to 50° C. in 30 minutes while being stirred with a magnetic stirrer. The mixture was reacted for a further one hour while keeping the temperature of the bath at 50° C. to obtain a liquid composition (sol solution). This sol solution was diluted with methanol/ethylene glycol=20/1 (weight ratio) to bring the content of the sol solution to 0.5% by weight. It was then applied to the substrate by a wheeler, and this was followed by drying at 100° C. for one minute. The coated amount at this time was 4 mg/$m^2$. The coated amount was defined by the amount of Si element found by X-ray fluorescence analysis.

Formation of an Image Forming Layer:

An image forming layer coating solution comprising a highly-sensitive photopolymerizable composition having the following components was applied to the aluminum plate treated in the above manner so that the dry coating weight was 1.5 g/$m^2$. It was dried at 100° C. for one minute to form a light-sensitive layer.

Composition of the Photopolymerizable Composition 1:

| | |
|---|---|
| Tetramethylolmethane tetraacrylate | 1.5 g |
| Filamentary organic high molecular polymer (B1) (allylmethacrylate/methacrylic acid copolymer, copolymer molar ratio: 80/20, weight average molecular weight: 45,000) | 2.0 g |
| Sensitizer (C1, following structure) ($\lambda$max THF479 nm, $\epsilon$ = 6.9 × $10^4$) | 0.15 g |
| Photopolymerization initiator (D1, following structure) | 0.2 g |
| Photoinitiator (E1) (trade name: IRGACURE 907, manufactured by Ciba-Geigy) | 0.4 g |
| Fluorine macromolecular compound (P-13) | 0.2 g |
| $\epsilon$-phthalocyanine/(B1) dispersion | 0.2 g |
| Methyl ethyl ketone | 9.0 g |
| Propylene glycol monomethyl ether acetate | 7.5 g |
| Toluene | 11.0 g |

Sensitizer (C1)

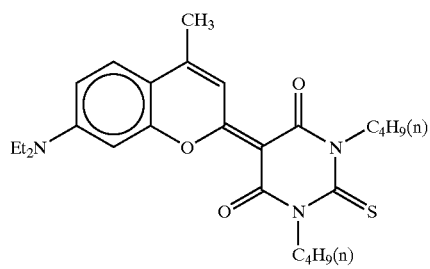

Photoinitiator (D1)

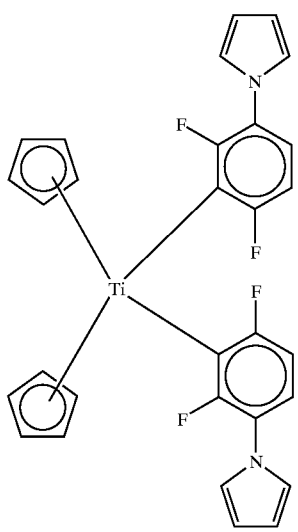

For the oxygen-cutting protective layer, an aqueous solution containing 3% by weight of polyvinyl alcohol (degree of saponification: 98 mol %, degree of polymerization: 500) was applied to this light-sensitive layer so that the dried coated amount was 2.5 g/m². It was dried at 120° C. for 3 minutes to obtain a photopolymerizable planographic printing plate precursor. The uniformity of the film of the image forming layer (light-sensitive layer) was good.

On the contrary, when excluding the fluorine macromolecular compound (P-13) was excluded from the above light-sensitive layer composition, the film was uneven and non-uniform (Comparative Example 7). Also, a comparative light-sensitive solution was prepared in the same manner except that P-13 was altered to R-1 used for the above comparative example. In the system to which P-13 was added, the foaming characteristics of the light-sensitive solution were surpressed, whereas when R-1 was added, foaming was high, and the anti-foaming characteristics were inferior (Comparative Example 8).

Evaluation of the Planographic Printing Plate Precursor:

The resulting plate was exposed by an exposure machine (Manufactured by Optronics, trade name: XLP4000 (Ar laser 75 mW, 488 nm)) at 4000 dpi and 175 lines/in. at every two positions between 1 to 99% in steps of 1%. Thereafter, the plate was exposed to an atmosphere kept at 120° C. for 20 seconds to carry out post-heating.

The plate was dipped in the following developing solution at 25° C. for 30 seconds to carry out developing.

Composition of the Developing Solution:

| 1K potassium silicate | 30 g |
|---|---|
| Potassium hydroxide | 15 g |
| Water | 1000 g |

Next, a gum solution (trade name: GU-7, manufactured by Fuji photo Film) was diluted with an equal volume of water to treat the surface of the plate. The quantity of energy on the plate surface required to regenerate 1% 4000 dpi and 175 lines/in. was measured as the sensitivity of the sample, and it was found that the energy was 0.2 mJ, showing that sufficient and a practical sensitivity was obtained.

Further, the quality of the dot at that exposure amount was good and unacceptable fogs and flares were not observed. Using a printer (manufactured by Heidelberg, trade name: SORKZ) and an ink (manufactured by Dainippon Ink and Chemicals, Incorporated, trade name: Kraf G(N)), a test for printing durability was carried out with the result that more than 180000 sheets of good prints were obtained.

The resulting plate material was stored at 60° C. for three days and thereafter exposed, developed and used for printing to thereby visually evaluate the plate and rate the stability over time. The sensitive material obtained just after coating was not changed in any respect at all for printing durability, stain prevention and image quality, indicating that the plate had good qualities.

Example 16

Next, examples of a thermo-crosslinking type planographic printing plate precursor will be shown.

Production of a Support

A 0.30-mm-thick aluminum plate (containing 99.5% or more of aluminum, 0.30% of Fe, 0.10% of Si, 0.02% of Ti and 0.013% of Cu) was degreased by washing with trichloroethylene. The surface was then pebbled with a nylon brush and a 400 mesh pumice stone-water suspension, and thoroughly washed with water. This plate was dipped in an aqueous 25% sodium hydroxide solution at 45° C. for 9 seconds to carry out etching, followed by washing with water. The plate was further dipped in 2% $HNO_3$ for 20 seconds, followed by washing with water. The amount of etching on the pebbled surface at this time was about 3 g/m². The resulting plate was treated using 7% $H_2SO_4$ as an electrolyte at a current density of 15A/dm² to form 3 g/m² of a DC anodic oxidation film. This was followed by washing with water and drying.

Next, this aluminum plate was coated with the following undercoating solution (B), and dried at 80° C. for 30 seconds. The coated amount after drying was 10 mg/m².

Composition of the Undercoating Solution (B):

| β-alanine | 0.10 g |
|---|---|
| Phenylphosphonic acid | 0.05 g |
| Methanol | 40 g |
| Pure water | 60 g |

Next, the following image forming layer coating solution (G) was prepared. This solution was applied to the above aluminum plate after it had been undercoated and dried at 100° C. for one minute to form an image forming layer, to thereby obtain a negative type planographic master plate. The coated surface condition was uniform and good. The coated amount after drying was 1.5 g/m².

Composition of the Image Forming Layer Coating Solution (G):

| | |
|---|---|
| Fluorine macromolecular compound (P-14) | 0.05 g |
| Acid generator [SH-1] | 0.3 g |
| Crosslinking agent "KZ-1" | 0.5 g |
| Binder polymer [BP-1] | 1.5 g |
| Infrared absorber [IK-1] | 0.07 g |
| Dye (manufactured by Hodogaya Chemical Co., Ltd., trade name: Aizen Spilon Blue C-RH) | 0.035 g |
| Methyl ethyl ketone | 12 g |
| Methyl alcohol | 10 g |
| 1-Methoxy-2-propanol | 8 g |

Poly(p-hydroxystyrene) (trade name: Maruka Linker M S-4P) manufactured by Maruzen Petrochemical was used as the binder polymer [BP-1] in the above image forming layer coating solution [G].

Also, the structure of the crosslinking agent [KZ-1], the acid generator [SH-1], and the infrared absorber [IK-1] used in he image forming layer coating solution [G] is shown below.

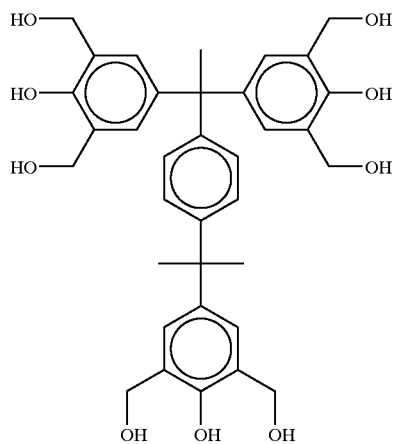

KZ-1

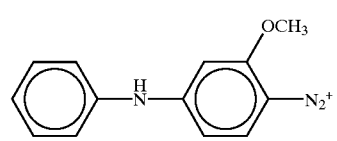

(SH-1)

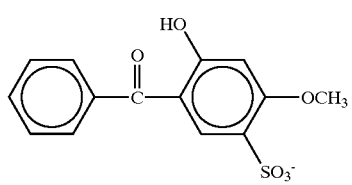

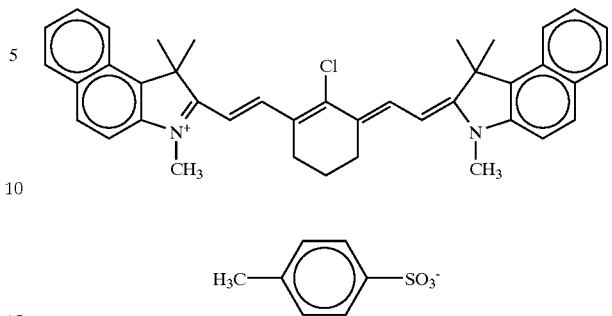

(IK-1)

Evaluation of the Planographic Printing Plate Precursor:

The surface of the resulting negative type planographic printing plate precursor was touched with bare hands, and then scan-exposed by using a semiconductor laser which emitted infrared rays having a wavelength of about 820 to 850 nm. After exposed, the plate was heated at 110° C. for 30 seconds with a panel heater and then developed with a developing solution (manufactured by Fuji Photo Film Co., Ltd., trade name: DP-4, (a water dilution (1:8) was used)). After an image was formed, it was visually judged whether or not the portion of the image touched with bare hands was lost. However, no image void was found.

Comparative Example 9

A coating solution was prepared in the same manner as in Example 16 except that the fluorine macromolecular compound P-14 was not used in the image forming layer coating solution [G] used in Example 16. This solution was applied to the aluminum plate which had been used and undercoated in Example 16, and dried at 100° C. for one minute to obtain a negative type planographic printing plate precursor. The coated surface condition of the resulting plate was uneven and non-uniform. Using this planographic printing plate precursor, an image was formed by the same procedure for Example 16. After the image was formed, it was visually judged whether or not the portion of the image touched with bare hands was lost. A clear image void was found.

Next, examples of a thermal positive type planographic printing plate precursor will be described.

Example 17

Production of a Copolymer 1:

A 20 ml three-neck flask equipped with a stirrer, a cooling tube, and a dropping funnel was filled with 4.61 g (0.0192 mol) of N-(p-aminosulfonylphenyl)methacrylamide, 2.94 g (0.0258 mol) of ethylmethacrylate, 0.80 g (0.015 mol) of acrylonitrile and 20 g of N-dimethylacetamide, and the mixture was stirred while heated at 65° C. in a hot water bath. 0.15 g of V-65 (trade name, manufactured by Wako Pure Chemical Industries, Ltd.) was added to the mixture, which was then stirred for 2 hours in a nitrogen stream while being kept at 65° C. To this reaction mixture were further added dropwise 4.61 g of N-(p-aminosulfonylphenyl) methacrylamide, 2.94 g of ethylmethacrylate, 0.80 g of acrylonitrile and 0.15 g of a mixture of N,N-dimethylacetamide and "V-65" over 2 hours using a dropping funnel.

After the dropwise addition was finished, the resulting mixture was stirred at 65° C. for 2 hours. With the reaction completed, 40 g of methanol was added to the reaction mixture, which was then cooled. The resulting mixture was poured into 2 l of water while stirring the water, and the mixture was stirred for 30 minutes. Then, the precipitates were taken out by filtration and dried to thereby obtain 15 g of a white solid. The weight average molecular weight (based on polystyrene) of this specified copolymer 1 was measured by gel permeation chromatography, and it was discovered 53,000.

Production of a Substrate:

A 0.3-mm-thick aluminum plate (containing 99.5% or more of aluminum, 0.30% of Fe, 0.10% of Si, 0.02% of Ti and 0.013% of Cu) was degreased by washing with trichloroethylene. The surface was then pebbled using a nylon brush and a 400 mesh pumice stone-water suspension, and thoroughly washed with water. The plate was dipped in an aqueous 25% sodium hydroxide solution at 45° C. for 9 seconds to carry out etching, followed by washing with water. The plate was further dipped in 20% nitric acid for 20 seconds, followed by washing with water. The amount of etching on the pebbled surface at this time was about 3 g/m². The resulting plate was then treated using 7% sulfuric acid as an electrolyte at a current density of 15A/dm² to form 3 g/m² of a DC anodic oxidation film. This was followed by washing with water and drying. The plate was then coated with the following undercoating solution (C), and the coated film was then dried at 90° C. for one minute. The coated amount after drying was 10 mg/m².

Composition of the Undercoating Solution (C):

| β-alanine | 0.5 g |
|---|---|
| Methanol | 95 g |
| Water | 5 g |

The resulting plate was treated using an aqueous solution containing 2.5% by weight of sodium silicate at 30° C. for 10 seconds. Then, the following undercoating solution (D) was applied to the plate and the coated film was dried at 80° C. for 15 seconds to obtain a substrate. The coated amount of the film after drying was 15 mg/m².

Composition of the Undercoating Solution (D):

| Compound shown below | 0.3 g |
|---|---|
| Methanol | 100 g |
| Water | 1 g |

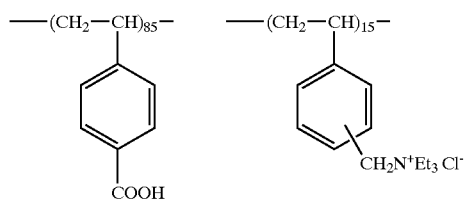

Molecular weight 28,000

Next, the following image forming layer coating solution 2 was prepared. This solution was applied to the resulting substrate so that the coated amount was 1.8 g/m², to obtain a planographic printing plate precursor which was superior in its light-sensitive layer coated surface.

Composition of the Image Forming Layer Coating Solution 2:

| Fluorine macromolecular compound (P-15) | 0.02 g |
|---|---|
| Copolymer 1 mentioned above | 0.75 g |
| m,p-Cresol novolac (m/p ratio = 6/4, weight average molecular weight 3,500, including 0.5% by weight of unreacted cresol) | 0.25 g |
| p-Toluenesulfonic acid | 0.003 g |
| Tetrahydrophthalic anhydride | 0.03 g |
| Cyanine dye (IK-1) | 0.017 g |
| Dye prepared by using a 1-naphthalenesulfonic acid anion as the counter anion of Victoria Pure Blue BOH | 0.015 g |
| γ-butyrolactone | 10 g |
| Methyl ethyl ketone | 10 g |
| 1-Methoxy-2-propanol | 1 g |

Evaluation of the Planographic Printing Plate Precursor:

The resulting planographic printing plate precursor was evaluated for developing stability against external harmful effects according to the following method. Using a continuous load type scratching strength tester (trade name: SB62 model, manufactured by Shinto Scientific Co., Ltd.) in which filter paper (manufacture by Advantec Toyo Kaisha, Ltd., trade name: No. 5C) was applied to a plane part of the scratching jig which part was 1 cm by 1 cm square on the plate, the surface of the sensitive material of the planographic printing plate precursor was scratched with an applied load of 10 g at a rate of 6 cm/sec. Next, the plate was exposed 5% dot-imagewise at a main scanning speed of 5 m/sec by a semiconductor laser having an output of 500 mW, a wavelength of 830 nm, and a beam diameter of 17 μm (1/e²). Then, the plate was developed for 30 seconds by a developing solution (manufactured by Fuji Photo Film Co., Ltd., trade name: DP-4 (1:8)). The resulting image formed good dots, and the image portion of the scratched portion was not dissolved at all. Therefore, the planographic printing plate of the invention proved to have high developing stability to external harmful effects.

Also, the image forming layer coating solution 2 had little-foaming and such a good coated surface that the number of pinholes was 5 or less per square meter.

Comparative Example 10

A planographic printing plate precursor was obtained in the same manner as in Example 17 except that the fluorine macromolecular compound (P-15) was not used in the image forming layer coating solution 2. The surface condition of the film was uneven and non-uniform. Next, this planographic printing plate precursor was evaluated for developing stability to external harmful effects in the same manner as in Example 17. In the scratched portion, the unexposed dot portion expected to take on an image was removed by developing.

Comparative Example 11

A planographic printing plate precursor was obtained in the same manner as in Example 17 except that the fluorine macromolecular compound (P-15) was altered to (R-2) used in the above comparative example in the image forming layer coating solution 2. The light-sensitive solution had high foaming characteristics and the time required for defoaming was 30 minutes or more, showing that this example was inferior in adaptability to production.

Next, this planographic printing plate precursor was evaluated for developing stability to external harmful effects in the same manner as in Example 17. In the scratched portion, the unexposed dot portion expected to take on an image was removed by developing.

It was understood that from the results of Examples 17 and Comparative Examples 10 and 11 that the addition of the specified fluorine macromolecular compound ensures a light-sensitive solution having superior foaming and anti-foaming characteristics, a good surface condition, and allows the light-sensitive layer to improve in stability to external harmful effects prior to developing.

Next, an example of a radical polymerization system thermal negative type planographic printing plate precursor will be shown.

Example 18

Production of a Support:

A molten bath of an aluminum alloy containing 99.5% or more of aluminum, 0.30% of Fe, 0.10% of Si, 0.02% of Ti and 0.013% of Cu was subjected to a cleaning process and then casted. The cleaning process involved degassing to remove unnecessary gases such as hydrogen, and also ceramic tube filter treatment. The casting was carried out using a DC casting method. A solidified ingot plate having a thickness of 500 nm was made into an aluminum rolled plate having a thickness of 10 nm from the surface. The average surface roughness Ra at the center line of the plate after cold rolling was restricted to 0.2 µm by controlling the roughness of the roll. Thereafter, the plate was subjected to a tensioning lever to improve plainness.

Next, surface treatment was carried out to make the plate into a planographic printing plate support.

First, in order to remove roll oil on the surface of the aluminum, degreasing treatment was carried out using an aqueous 10% sodium aluminate solution at 50° C. for 30 seconds and neutralization and desmutting were carried out using an aqueous 30% sulfuric acid solution at 50° C. for 30 seconds.

Then a treatment for roughening the surface of the support, namely, pebbling, was carried out to obtain a high adhesion between the support and the light-sensitive layer and to provide the non-image portion with water retentivity. Electrolytic pebbling was carried out by supplying a quantity of electricity of 240 C/dm² at the anode side by an indirect feeder cell supplying current with a current density of 20 A/dm² and with an alternating waveform of a duty ratio 1:1, while an aqueous solution containing 1% of nitric acid and 0.5% of aluminum nitrate was kept at 45° C. and an aluminum web was allowed to flow into the aqueous solution. After that, etching was carried out using an aqueous 10% sodium aluminate solution at 50° C. for 30 minutes and neutralization and desmutting were carried out using an aqueous 30% sulfuric acid solution at 50° C. for 30 seconds.

Further, in order to improve wear resistance, chemical resistance and water retentivity, an oxide film was formed on the support by anodic oxidation. Using an aqueous 20% sulfuric acid solution as an electrolyte at 35° C., electric treatment was performed by an indirect feeder cell supplying a DC current of 14 A/dm² while conveying an aluminum web through the electrolyte to produce 2.5 g/m² of an anodic oxidation film.

Undercoating:

Next, the following undercoating solution (E) was applied to this aluminum support by using a wire bar so that the amount of the solid of the dried coating was 5 mg/m², and then it was dried at 90° C. for 30 seconds with a hot air drier.

Composition of the Undercoating Solution (E):

| 2-Aminoethylphosphonic acid | 0.1 g |
|---|---|
| Phenylphosphonic acid | 0.1 g |
| Methanol | 75 g |
| Water | 25 g |

Formation of an Image Forming Layer:

The following image forming layer coating solution 3 was applied to the above undercoated support by using a wire bar, and it was dried at 115° C. for 45 seconds with a hot air drier to obtain a negative type planographic printing plate precursor. The coated surface condition was highly uniform. The coated amount was 1.3 g/m².

Composition of the Image Forming Layer Coating Solution 3:

| Light-heat converting agent (cyanine dye TN-1: structure shown below) | 0.10 g |
|---|---|
| Radical generator (sulfonium salt compound TN-2: structure show below) | 0.30 g |
| Addition polymerizable unsaturated compound (dipentaerythritol hexaacrylate) | 1.00 g |
| Alkali-soluble binder polymer (copolymer of allylmethacrylate and methacrylic acid, copolymerization molar ratio: 83:17 and weight average molecular weight: 125,000) | 1.2 g |
| Colorant (naphthalenesulfonate of Victoria Pure Blue) | 0.04 g |
| Fluorine macromolecular compound (P-5) | 0.005 g |
| Methyl ethyl ketone | 10.0 g |
| 1-Methoxy-2-propanol | 8.0 g |

Cyanine Dye TN-1

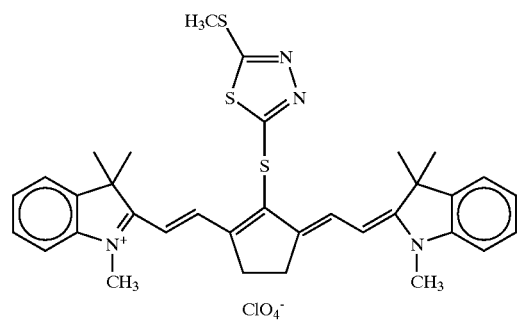

Sulfonium Salt Compound TN-2

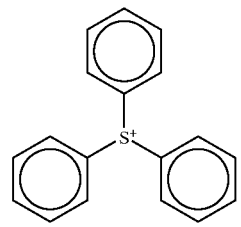

-continued

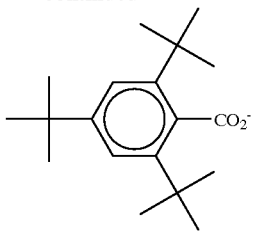

Evaluation of the Planographic Printing Plate Precursor:

The resulting negative type planographic printing plate precursor was exposed 50% dot-imagewise by using an exposure machine (manufactured by Creo, trade name: Trendsetter 3244VFS) mounted with a water-cooling type 40 W infrared semiconductor laser under the following conditions that the power output was 9 W; the number of rotations of outer surface drum was 210 rpm; the opposite surface energy was 100 mJ/cm$^2$; and the resolution was 2400 dpi.

Next, the resulting plate was developed using an automatic developing machine (manufactured by Fuji Photo Film Co., Ltd., trade name: Stablon 900 N). For the developing solution and replenishing solution, the composition described above was used. The temperature of the developing bath was 30° C. and the finisher was a water dilution (1:1, pH=10.8) of FN-6 (trade name, manufactured by Fuji Photo Film Co., Ltd.). A uniform and good dot image was obtained. The resulting planographic printing plate was placed in a printer (manufactured by Heidelberg, trade name: Heider SOR-M) to obtain more than 10000 sheets of prints.

The image forming layer coating solution 3 of the present example also had low foaming characteristics, and the time required for defoaming was within 5 minutes, thereby showing sufficient suitbility for production.

Comparative Example 12

A planographic printing plate precursor was produced in the same manner as in Example 18 except that the fluorine macromolecular compound (P-5) was excluded from the above image forming layer coating solution 3. The image forming layer had insufficient uniformity. Further, exposure and developing were performed in the same manner as in Example 18, but with the result that the dot image portion was damaged.

Comparative Example 13

A planographic printing plate precursor was produced in the same manner as in Example 18 except that the fluorine macromolecular compound (P-5) of the above comparative example was altered to R-4. This image forming layer coating solution had high foaming characteristics and the time required for defoaming was 30 minutes or more, showing that this coating solution had inferior to production suitability.

The image forming layer also had insufficient uniformity. Further, exposure and developing treatments were performed in the same manner as in Example 18, but with the result that the dot image portion was damaged.

It is understood from the results of Example 18 and Comparative Examples 12 and 13 that the use of the fluorine macromolecular compound according to the invention ensures a thermal negative type planographic printing plate having a uniform surface with improved resistance of the image portion to the developing solution.

The planographic printing plate precursor of the invention is provided with a highly uniform image forming layer without such production failures as foaming. The hydrophobic characteristics of the surface of the image portion are good, there is superior resistance to the developing solution, and an excellent adhering ability, printing durability, and removability of the non-image portion are obtained.

What is claimed is:

1. A planographic printing plate precursor comprising a support having disposed thereon an image forming layer containing a fluorine macromolecular compound having a structural unit derived from a monomer represented by the following general formula (I):

General formula (I)

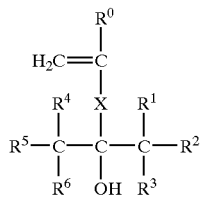

wherein $R^0$ represents a hydrogen atom, a methyl group, a cyano group or a halogen atom; X represents a single bond or a divalent connecting group; $R^1$ to $R^6$ each independently represent a hydrogen atom, an alkyl group, a fluorine atom or an alkyl group in which at least one hydrogen atom is substituted with a fluorine atom; and at least one of $R^1$ to $R^6$ represents a fluorine atom or an alkyl group in which at least one hydrogen atom is substituted with a fluorine atom;

wherein said support is made from a material selected from the group consisting of paper, paper laminated with plastic, metal plates whose surfaces are treated to be hydrophilic, plastic films, and paper or plastic films on which metals whose surfaces are treated to be hydrophilic are laminated or deposited.

2. The planographic printing plate precursor according to claim 1, wherein, in said general formula (I), X represents an alkylene group having 1 to 10 carbon atoms, an alkylene group having a cyclic structure and 6 to 14 carbon atoms, or an aralkylene group having 7 to 15 carbon atoms.

3. The planographic printing plate precursor according to claim 1, wherein, in said general formula (I), X represents a phenylene group or a methylene group.

4. The planographic printing plate precursor according to claim 1, wherein said fluorine macromolecular compound has at least one structural unit derived from poly (oxyalkylene)acrylate and/or poly(oxyalkylene) methacrylate.

5. The planographic printing plate precursor according to claim 1, wherein said fluorine macromolecular compound has a structural unit derived from a monomer represented by the following general formula (II):

General formula (II)

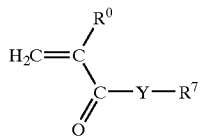

wherein $R^0$ represents a hydrogen atom, a methyl group, a cyano group or a halogen atom; Y represents a single bond or a divalent connecting group; and $R^7$ represents an alkyl group having 1 to 20 carbon atoms.

6. The planographic printing plate precursor according to claim 5, wherein, in the general formula (II), Y represents an oxygen atom, —N(H)— or —N (CH$_3$)—.

7. The planographic printing plate precursor according to claim 5, wherein, in the general formula (II), R$^7$ represents an alkyl group having 4 to 20 carbon atoms.

8. The planographic printing plate precursor according to claim 1, wherein said fluorine macromolecular compound further has at least one structural unit derived from poly(oxyalkylene)acrylate and/or poly(oxyalkylene) methacrylate.

9. The planographic printing plate precursor according to claim 2, wherein said fluorine macromolecular compound further has at least one structural unit derived from poly(oxyalkylene)acrylate and/or poly(oxyalkylene) methacrylate.

10. The planographic printing plate precursor according to claim 1, wherein the structural unit derived from the monomer represented by said general formula (I) is contained in an amount of 5 mol % or more in all structural units constituting said fluorine macromolecular compound.

11. The planographic printing plate precursor according to claim 8, wherein the structural unit derived from said poly(oxyalkylene)acrylate and/or poly(oxyalkylene) methacrylate is contained in an amount of 10 mol % or more in all structural units of said fluorine macromolecular compound.

12. The planographic printing plate precursor according to claim 5, wherein the content of the structural unit derived from the monomer represented by the general formula (II) is 3 mol % or more in all structural units constituting said fluorine macromolecular compound.

13. The planographic printing plate precursor according to claim 1, wherein the weight average molecular weight of said fluorine macromolecular compound is in the range of 3,000 to 100,000.

14. The planographic printing plate precursor according to claim 1, wherein the amount of said fluorine macromolecular compound to be added is in the range of 0.005 to 8% by weight based on the total composition (converted into solid) constituting said image forming layer.

15. The planographic printing plate precursor according to claim 1, wherein said image forming layer is a positive image forming layer.

16. The planographic printing plate precursor according to claims 1, wherein said image forming layer is a negative image forming layer.

17. The planographic printing plate precursor according to claim 1, wherein said support is an aluminum plate.

* * * * *